United States Patent
Kuo et al.

(10) Patent No.: US 6,768,429 B2
(45) Date of Patent: Jul. 27, 2004

(54) MULTIPLEXING AN ADDITIONAL BIT STREAM WITH A PRIMARY BIT STREAM WITH CONVERSION BETWEEN QB/RB AND XB/YB ENCODED BIT STREAMS

(75) Inventors: Jerchen Kuo, Davis, CA (US); Gerry Pesavento, Davis, CA (US)

(73) Assignee: Teknovus, Inc., Petaluma, CA (US)

( * ) Notice: Subject to any disclaimer, the term of this patent is extended or adjusted under 35 U.S.C. 154(b) by 0 days.

(21) Appl. No.: 10/617,507

(22) Filed: Jul. 11, 2003

(65) Prior Publication Data

US 2004/0075594 A1 Apr. 22, 2004

Related U.S. Application Data

(63) Continuation-in-part of application No. 10/245,854, filed on Sep. 17, 2002, now Pat. No. 6,624,763.
(60) Provisional application No. 60/360,827, filed on Feb. 28, 2002.

(51) Int. Cl.[7] .............................................. H03M 5/00
(52) U.S. Cl. ............................ 341/58; 341/59; 341/95
(58) Field of Search ............................. 341/58, 59, 51, 341/95

(56) References Cited

U.S. PATENT DOCUMENTS

| | | | |
|---|---|---|---|
| 4,488,739 A | | 12/1984 | Franaszek et al. |
| 5,387,911 A | * | 2/1995 | Gleichert et al. .............. 341/95 |
| 6,198,413 B1 | | 3/2001 | Widmer |
| 6,204,781 B1 | * | 3/2001 | Aziz et al. ..................... 341/59 |
| 6,266,344 B1 | * | 7/2001 | Fujimori et al. ............ 370/468 |
| 6,295,272 B1 | | 9/2001 | Feldman et al. |
| 6,333,704 B1 | | 12/2001 | Jung et al. |
| 6,385,738 B1 | | 5/2002 | Lo |
| 6,496,540 B1 | * | 12/2002 | Widmer ....................... 375/242 |
| 6,574,731 B1 | * | 6/2003 | Coles et al. ................. 713/168 |
| 6,606,328 B1 | * | 8/2003 | Susnow ....................... 370/465 |
| 2001/0024467 A1 | | 9/2001 | Barry et al. |

OTHER PUBLICATIONS

Frasier, Howard, Clause 36, Physical Coding Sublayer (PCS) and Physical Medium Attachment (PMA) sublayer, type 1000BASE–X, IEEE Std 802.3, 2000 Edition, Local and Metropolitan Area Networks, pp. 962–1.

* cited by examiner

*Primary Examiner*—Brian Young
*Assistant Examiner*—John B Nguyen
(74) *Attorney, Agent, or Firm*—Mark Wilson

(57) ABSTRACT

Managing a primary bit stream involves converting a qB/rB encoded bit stream to an xB/yB encoded bit stream and multiplexing an additional bit stream with the xB/yB encoded bit stream at a transmission side of a link. The additional bit stream is then demultiplexed from the xB/yB encoded bit stream and the xB/yB encoded bit stream is converted back to the qB/rB encoded bit stream at the receiver side of the link. The qB/rB encoded bit stream is converted to and from the xB/yB encoded bit stream so that the additional bit stream can be multiplexed with the qB/rB encoded bit stream using multiplexing/demultiplexing systems that are compatible with the xB/yB multiplexing system. In an application, a 4B/5B encoded bit stream is converted to an 8B/10B encoded bit stream and an additional bit stream is multiplexed with the 10B code-words of the 8B/10B encoded bit stream using code-word manipulation.

58 Claims, 14 Drawing Sheets

| A | B | C | D | E | F |
|---|---|---|---|---|---|
| Sequence Number | Primary Bit Stream (8B words) | 10B Code Name | 10B Code for Current RD− | 10B Code for Current RD+ | 10B Code Selection Logic |
| 1 | 000 00001 | /D1.0/ | 011101 0100 | 100010 1011 | 10B Code selected to balance the running disparity of the encoded bit stream |
| 2 | 000 00101 | /D5.0/ | 101001 1011 | 101001 0100 | 10B Code selected to balance the running disparity of the encoded bit stream |
| 3 | 000 11010 | /D26.0/ | 010110 1011 | 010110 0100 | 10B Code selected to balance the running disparity of the encoded bit stream |
| 4 | 000 01111 | /D15.0/ | 010111 0100 | 101000 1011 | 10B Code selected to balance the running disparity of the encoded bit stream |

FIG. 1
(PRIOR ART)

| A | B | C | D | E | F | G |
|---|---|---|---|---|---|---|
| Sequence Number | Primary Bit Stream (8B words) | 10B Code Name | 10B Code for Current RD− | 10B Code for Current RD+ | Additional Bit Stream | 10B Code Selection Logic |
| 1 | 000 00001 | /D1.0/ | 011101 0100 | 100010 1011 | 0 | 10B Code selected to represent the bit of the additional bit stream |
| 2 | 000 00101 | /D5.0/ | 101001 1011 | 101001 0100 | | 10B Code selected to balance the running disparity of the encoded bit stream |
| 3 | 000 11010 | /D26.0/ | 010110 1011 | 010110 0100 | 1 | 10B Code selected to represent the bit of the additional bit stream |
| 4 | 000 01111 | /D15.0/ | 010111 0100 | 101000 1011 | | 10B Code selected to balance the running disparity of the encoded bit stream |

FIG. 2

| A | B | C | D | E(+) | F(-) | G | H | I | J | K | L | M | N |
|---|---|---|---|---|---|---|---|---|---|---|---|---|---|
| | Data Bits (8B Codes) | Byte Value | 10B Code Name | 10B Code for Current RD− (DC Balance + or Neutral) | 10B Code for Current RD+ (DC Balance − or Neutral) | New RD | RD Before Code Selection | Selected 10B Code | RD After Code Selection | Multiplexed Additional Bit Stream | RD Before Code Selection | Selected 10B Code | RD After Code Selection |
| 1 | 000 00001 | 01 | /D1.0/ | 011101 0100 | 100010 1011 | S | − | + | − | 0 | − | − | − |
| 2 | 000 00101 | 05 | /D5.0/ | 101001 1011 | 101001 0100 | F | − | + | + | | − | + | + |
| 3 | 000 11010 | 1A | /D26.0/ | 010110 1011 | 010110 0100 | F | + | − | − | 1 | + | + | + |
| 4 | 000 01111 | 0F | /D15.0/ | 010111 0100 | 101000 1011 | S | − | + | − | 0 | + | − | + |
| 5 | 100 11101 | 9D | /D29.4/ | 101110 0010 | 010001 1101 | S | − | + | − | | + | − | + |
| 6 | 011 11111 | 7F | /D31.3/ | 101011 0011 | 010100 1100 | F | + | − | + | 0 | + | − | − |
| 7 | 101 01111 | AF | /D15.5/ | 010111 1010 | 101000 1010 | F | − | + | + | | − | − | − |
| 8 | 110 11000 | D8 | /D24.6/ | 110011 0110 | 001100 0110 | F | − | − | + | 1 | + | + | + |
| 9 | 001 11111 | 3F | /D31.1/ | 101011 1001 | 010100 1001 | F | + | + | + | | + | + | + |
| 10 | 111 11110 | FE | /D30.7/ | 011110 0001 | 100001 1110 | F | − | + | + | 0 | + | − | + |
| 11 | 001 00111 | 27 | /D7.1/ | 111000 1001 | 000111 1001 | F | − | − | − | | + | − | − |
| 12 | 001 01111 | 2F | /D15.1/ | 010111 1001 | 101000 1001 | S | − | + | − | 1 | + | − | − |
| 13 | 000 10110 | 16 | /D22.0/ | 011010 1011 | 011010 0100 | F | + | − | − | | − | + | + |

FIG. 7

MULTIPLEXING AN ADDITIONAL BIT STREAM WITH A PRIMARY BIT STREAM WITH CONVERSION BETWEEN QB/RB AND XB/YB ENCODED BIT STREAMS

CROSS-REFERENCE TO RELATED APPLICATION

This application is continuation-in-part of U.S. patent application Ser. No. 10/245,854, filed Sep. 17, 2002 now U.S. Pat. No. 6,624,763, which is entitled to the benefit of provisional U.S. Patent Application Serial No. 60/360,827, filed Feb. 28, 2002.

FIELD OF THE INVENTION

The invention relates to bit stream multiplexing in digital communications networks, and more particularly to the multiplexing of an additional bit stream with a primary bit stream, where the primary bit stream is initially encoded into a q-bit/r-bit (qB/rB) encoded bit stream.

BACKGROUND OF THE INVENTION

High-speed digital communications networks typically transmit digital data as a series of 1's and 0's. In order for the digital data to be deciphered at the speeds that are required in today's networks, it is often desirable to transmit a digital data stream with a balanced number of 1's and 0's and a high transition density. A balanced number of 1's and 0's is desired in a digital data stream because a balanced number of 1's and 0's leads to an electronic signal with a balanced number of voltage transitions between a high voltage (typically representing a 1) and a low voltage (typically representing a 0). An electronic signal with a balanced number of voltage transitions is said to be direct current (DC) balanced. A DC balanced signal with a high transition density is important to prevent transformer core saturation and to ensure correct phase locked loop (PLL) operation when coupling a DC signal into an alternating current (AC) medium.

Ethernet is an example of a protocol that is widely used to accomplish digital communications. Some of the higher speed generations of Ethernet require DC balanced bit streams with a high transition density. In particular, one gigabit-per-second Ethernet (GbE) is a generation of Ethernet that requires a DC balanced bit stream with a high transition density. In order to achieve DC balance and a high transition density, GbE utilizes an 8-bit to 10-bit (8B/10B) encoding scheme that is defined by the IEEE in its 802.3 standard (Clause 36, Physical Coding Sublayer (PCS) and Physical Medium Attachment (PMA) sublayer, type 1000BASE-X). Using the 8B/10B encoding scheme, there are 1,024 ($2^{10}$) 10B code-words available to represent 256 ($2^8$) 8B words. From the 1,024 available 10B code-words, two 10B code-words are selected to represent each 8B word. The 10B code-words that are selected to represent each 8B word are the 10B code-words that are balanced with respect to the number of 1's and 0's (that is, each 10B code-word has the same number of 1's and 0's) or the code-words that are nearly balanced with respect to the number of 1's and 0's (that is, each 10B code-word has six 1's and four 0's or four 1's and six 0's). The selected 10B code-words are then divided into two categories, one category that tends to exhibit a positive DC balance (i.e., those 10B code-words that tend to have more 1's than 0's) and another category that tends to exhibit negative DC balance (i.e., those 10B code-words that tend to have more 0's than 1's). The specific 10B code-words within the two categories of 10B code-words are identified in Clause 36 of the above-identified Ethernet standard.

Upon transmitting a series of 10B code-words across a GbE link, a tally is kept as to whether the pattern of codes is leaning towards too many 1's (RD+ or positive disparity) or leaning towards too many 0's (RD− or negative disparity). The tally is referred to generally as the running disparity, or RD. The RD is used as the basis for determining from which category the next 10B code-word should be selected to represent each subsequent 8B word. For example, if the RD is positive, then a 10B code-word from the category that tends to exhibit more 0's than 1's is selected to represent the next 8B word in the bit stream and if the RD is negative, then a 10B code-word from the category that tends to exhibit more 1's than 0's is selected to represent the next 8B word in the bit stream. FIG. 1 is a table that depicts the code selection logic for an example data stream that is represented by a sequence of 8B words. With reference to FIG. 1, column A identifies the sequence numbers of 8B words, column B identifies 8B words of the primary bits stream, column C identifies the 10B code name for the respective 8B word, column D identifies the respective 10B code-words from the category of code-words that tends to exhibit positive DC balance, column E identifies the respective 10B code-words from the category of code-words that tends to exhibit negative DC balance, and column F identifies the code selection logic that is applied to selecting one of the 10B code-words in the two categories of code-words to represent the respective 8B word. As indicated in column F of FIG. 1, each of the 10B code-words in the bit stream is selected, from the two categories of code-words, to balance the RD of the bit stream. By manipulating the selection of 10B code-words between the two categories, the RD of the transmitted code-words can be tightly controlled, thereby ensuring a DC balanced signal.

Although 8B/10B encoding works well to ensure a DC balanced signal, one disadvantage to 8B/10B encoding is that it increases the actual rate at which bits must be transmitted in order to achieve a desired data transfer rate. For example, because 10 bits of coding must be transmitted for each 8 bits of data, bits must be transmitted at a line rate of 1.25 gigabits per second (Gbps) to achieve an effective data transmission rate of 1 Gbps. Utilizing this 8B/10B encoding scheme, the transmission efficiency of GbE is approximately 80% (1 Gbps/1.25 Gbps).

Another disadvantage to Ethernet is that Ethernet is an unsynchronized network protocol that transmits traffic in packet bursts. In leading edge digital communications networks, it is desirable to be able to carry digital voice and data over the same network. Transmitting traffic in bursts in an unsynchronized network is not naturally suited for constant bit rate traffic, such as digital voice traffic, that is sensitive to time delay and jitter.

In view of the stated shortcomings of xB/yB encoding schemes, and particularly 8B/10B encoding for GbE, what is needed is a technique that increases the efficiency of xB/yB encoding, that is well suited for constant bit rate traffic, and that is compatible with widely accepted xB/yB encoding standards, such as the GbE standard. In addition, the technique should be compatible with other encoded bit streams.

SUMMARY OF THE INVENTION

A technique for managing a primary bit stream involves converting a qB/rB encoded bit stream to an xB/yB encoded bit stream and multiplexing an additional bit stream with the xB/yB encoded bit stream at a transmission side of a link.

The additional bit stream is then demultiplexed from the xB/yB encoded bit stream and the xB/yB encoded bit stream is converted back to the qB/rB encoded bit stream at the receiver side of the link. The qB/rB encoded bit stream is converted to and from the xB/yB encoded bit stream so that the additional bit stream can be multiplexed with the qB/rB encoded bit stream using multiplexing/demultiplexing systems that are compatible with the xB/yB multiplexing system. In a particular application, at the transmission side of a link, a 4B/5B encoded bit stream is converted to an 8B/10B encoded bit stream and an additional bit stream is multiplexed with the 10B code-words of the 8B/10B encoded bit stream using code-word manipulation. At the receiver side of the link, the additional bit stream is demultiplexed from the 10B code-words of the 8B/10B encoded bit stream and then the xB/yB encoded bit stream is converted back to the qB/rB encoded bit stream. Performing the conversions between 4B/5B and 8B/10B encoded bit streams allows an additional bit stream to be multiplexed over 100M Ethernet link using the same application specific integrated circuit (ASIC), or ASICs, that is used to multiplex an additional bit stream over a 1 GbE link.

A technique for multiplexing an additional bit stream with a primary bit stream, where the primary bit stream is encoded into an xB/yB encoded bit stream, involves selecting yB code-words to convey bits of the additional bit stream. In an xB/yB encoding scheme, each xB word of the primary bit stream can be represented by one yB code-word from a corresponding group of yB code-words, with each group of yB code-words including at least one yB code-word that belongs to a category of yB code-words that tends to exhibit positive DC balance and at least one yB code-word that belongs to a category of yB code-words that tends to exhibit negative DC balance. In an embodiment, the yB code-words in one of the categories are used to represent 1's and the yB code-words in the other category are used to represent 0's. Bits from the additional bit stream are multiplexed with the primary bit stream by selecting yB code-words from one of the two categories to convey 1's and by selecting yB code-words from the other category to convey 0's. In an embodiment, when yB code-words are not being selected to convey bits of the additional bit stream, the yB code-words are selected to balance the RD of the encoded bit stream.

In an embodiment, the selection of yB code-words is alternated between multiplexing a bit of the additional bit with the primary bit stream and balancing the RD of the encoded bit stream. The additional bit stream is demultiplexed from the encoded bit stream by identifying the category of yB code-words to which a multiplexed yB code-word belongs. For example, yB code-words belonging to one category of the yB code-words represent 1's (i.e., the category of yB code-words that tends to exhibit positive DC balance) and yB code-words belonging to the other category of the yB code-words represent 0's (i.e., the category of yB code-words that tends to exhibit negative DC balance).

An advantage of the bit multiplexing technique is that additional bandwidth can be provided in an xB/yB encoded bit stream while the overall DC balance of the encoded bit stream is maintained. The additional bandwidth provided by the multiplexing technique does not steal bandwidth from the primary bit stream and as a result, the overall bandwidth efficiency of the xB/yB encoded bit stream is improved.

Other aspects and advantages of the present invention will become apparent from the following detailed description, taken in conjunction with the accompanying drawings, illustrating by way of example the principles of the invention.

BREIF DESCRIPTION OF THE DRAWINGS

FIG. 1 is a table that depicts an example of code selection logic for a sequence of 8B words from a primary bit stream as is known in the prior art.

FIG. 2 depicts an example of code selection logic that is involved with multiplexing an additional bit stream with a primary bit stream in an 8B/10B encoded GbE bit stream in accordance with an embodiment of the invention.

FIG. 7 depicts a table that details the differences between the encoding of a GbE bit stream according to the prior art and the encoding of a GbE bit stream that includes a multiplexed additional bit stream in accordance with an embodiment of the invention.

DETAILED DESCRIPTION

Figure 3:
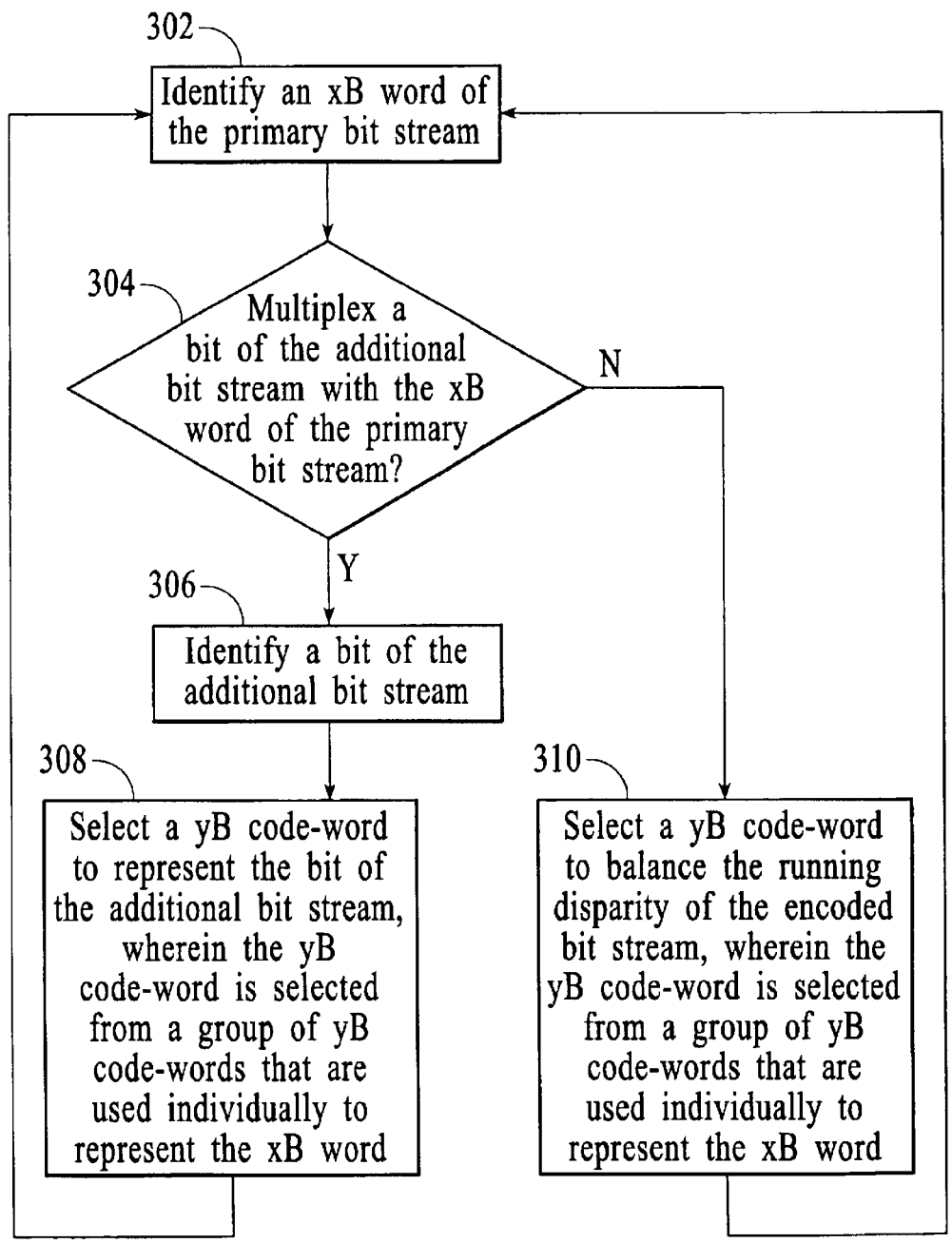
FIG. 3 depicts a process flow diagram of a method for multiplexing an additional bit stream with a primary bit stream where the primary bit stream is encoded into an xB/yB encoded bit stream in accordance with an embodiment of the invention.

A technique for multiplexing an additional bit stream with a primary bit stream, where the primary bit stream is encoded into an xB/yB encoded bit stream, involves selecting yB code-words to convey the additional bit stream. In an xB/yB encoding scheme, each xB word can be represented by one yB code-word from a corresponding group of yB code-words, with each group of yB code-words including at least one yB code-word that belongs to a category of yB code-words that tends to exhibit positive DC balance and at least one yB code-word that belongs to a category of yB code-words that tends to exhibit negative DC balance. In an embodiment, the yB code-words in one of the categories are used to represent 1's and the yB code-words in the other category are used to represent 0's. Bits from the additional bit stream are multiplexed with the primary bit stream by selecting yB code-words from one of the two categories to convey 1's and by selecting yB code-words from the other category to convey 0's. In an embodiment, when yB code-words are not being selected to convey bits of the additional bit stream, the yB code-words are selected to balance the RD of the encoded bit stream.

In an embodiment, the selection of yB code-words is alternated between multiplexing a bit of the additional bit with the primary bit stream and balancing the RD of the encoded bit stream. The additional bit stream is demultiplexed from the encoded bit stream by identifying the category of yB code-words to which a multiplexed yB code-word belongs. For example, yB code-words belonging to one category of the yB code-words represent 1's (i.e., the category of yB code-words that tends to exhibit positive DC balance) and yB code-words belonging to the other category of the yB code-words represent 0's (i.e., the category of yB code-words that tends to exhibit negative DC balance).

FIG. 2 depicts an example of code selection logic that is involved with multiplexing an additional bit stream with a primary bit stream in an 8B/10B encoded GbE bit stream in accordance with an embodiment of the invention. Specifically, FIG. 2 depicts a series of bits of the primary bit stream, with the series of bits being presented as a sequence of 8B words. In the example of FIG. 2, the series of bits of the primary bit stream is the same as the series of bits provided in the example of FIG. 1. The 8B words are identified in column B and the sequence number of each 8B word is identified in column A. Each 8B word is represented by two 10B code-words, as identified in columns D and E, and the corresponding 10B code names of the 10B code-words are identified in column C. In the example of FIG. 2, the 8B/10B encoding scheme is defined by the IEEE 802.3 standard at Clause 36 entitled "Physical Coding Sublayer (PCS) and Physical Medium Attachment (PMA) sublayer, type 1000BASE-X," which is incorporated by reference herein. In the example of FIG. 2, a single bit of the additional bit stream is multiplexed with the primary bit stream at every other 8B word of the primary bit stream. The bits of the additional bit stream that are to be multiplexed with the primary bit stream are identified in column F of FIG. 2. As shown in FIG. 2, a first bit (0) of the additional bit stream is to be multiplexed with the first 8B word (sequence number 1) and a second bit (1) of the additional bit stream is to be multiplexed with the third 8B word (sequence number 3). As stated above, each 8B word can be identified by at least one 10B code-word from the category of 10B code-words that tends to exhibit positive DC balance (i.e., column D) and by at least one 10B code-word from the category of 10B code-words that tends to exhibit negative DC balance (i.e., column E). The bits of the additional bit stream are multiplexed with the primary bit stream by dictating the category from which the 10B code-words are selected. For example, the 10B code-words from the category of 10B code-words that tends to exhibit positive DC balance are selected to multiplex 1's (i.e., "high" bits) with the primary bit stream and the 10B code-words from the category of 10B code-words that tends to exhibit negative DC balance are selected to multiplex 0's (i.e., "low" bits) with the primary bit stream. When bits are not being multiplexed with the primary bit stream, the 10B code-words are selected to balance the RD of the encoded bit stream.

In accordance with an embodiment of the invention, the 10B code-word selection logic for each 8B word is identified in column G of FIG. 2. Referring to column G, the first 10B code-word is selected to multiplex a bit of the additional bit stream (see sequence number 1) and the next 10B code-word is selected to balance the RD of the encoded bit stream (see sequence number 2). In the example of FIG. 2, the additional bits are multiplexed in an alternating fashion such that one 10B code-word is selected to multiplex a bit with the primary bit stream and the next 10B code-word is selected to balance the RD of the encoded bit stream. The process is repeated as necessary to convey the additional bit stream. While the code selection logic depicted in FIG. 2 alternates at each 8B word between selecting a 10B code-word to multiplex a bit and selecting a 10B code-word to balance the RD, the code selection logic that is known in the prior art and that is depicted in FIG. 1 is focused solely on balancing the RD of the encoded bit stream.

Although the example described with reference to FIG. 2 involves additional bits being multiplexed with every other 10B code-word, the interval of bit multiplexing can be different. For example, every $n^{th}$ 10B code-word can be manipulated to multiplex a bit of data, where n is an integer of two or greater ($n \geq 2$). In addition, a pattern of 10B code-words other than a constant interval can be used to multiplex bits as long as the pattern is known by the receiving end device. The particular distribution of multiplexed bits is not critical as long as the distribution is known by the receiving end device.

Although additional bits can be multiplexed every $n^{th}$ yB code-word, where n is an integer of two or greater ($n \geq 2$), or in other known patterns, additional bits should not be multiplexed at every yB code-word over an extended series of code-words. Additional bits should not be multiplexed at every yB code-word over an extended series of code-words because it would interfere with the ability to ensure that the encoded bit stream exhibits a balanced RD. That is, if none of the yB code-words in an extended series of code-words are selected to balance the RD of the encoded bit stream, then the RD of the encoded bit stream would drift as a function of the additional bit stream with no assurance that the RD of the encoded bit stream would be balanced. Although bits should not be multiplexed at every yB code-word over an extended series of code-words, particular distributions with successive multiplexed bits may be implemented.

Although the multiplexing scheme is described above with reference to an 8B/10B encoding scheme for example purposes, the multiplexing scheme is applicable to other xB/yB encoding schemes (i.e., 4B/5B encoding for 100 Mbps Ethernet), where x is less than y. In addition, although the multiplexing scheme is described with reference to the IEEE 802.3 GbE standard, the multiplexing scheme can be applied to other transmission techniques or standards that use xB/yB encoding.

The same encoding scheme can be used with data code groups and/or special code groups (i.e., the "D" codes and "K" codes as defined in the IEEE 802.3 GbE standard). For example, when there is no in-band traffic (i.e., D codes) being transmitted across a link, special codes, including ordered sets such as Idle codes, can be manipulated in a similar manner as described above to multiplex an additional bit stream with an encoded bit stream. Multiplexing bits of the additional bit stream using D codes or K codes enables the bits of the additional bit stream to be conveyed at a constant rate regardless of the transmission patterns of the in-band traffic.

In an embodiment, the additional bit stream that is multiplexed with the primary bit stream conveys constant bit rate (CBR) traffic. For example, the additional bits stream may convey voice traffic such as time division multiplexed (TDM) voice traffic. In an embodiment, the additional bit stream includes CBR traffic, such as E1, T1, E3, DS-3, OCn, and/or ISDN. In a GbE embodiment in which an additional bit stream is multiplexed with the primary bit stream at every other 10B code-word, the additional bit stream can be conveyed at a rate of 62.5 Mbps.

FIG. 3 depicts a process flow diagram of a method for multiplexing an additional bit stream with a primary bit stream, where the primary bit stream is encoded into an xB/yB encoded bit stream. At block 302, a first xB word of the primary bit stream is identified. At decision block 304, a determination is made as to whether or not a bit from the additional bit stream is to be multiplexed with the respective xB word. If a bit from the additional bit stream is to be multiplexed with the respective xB word, then at block 306, the bit of the additional bit stream is identified. At block 308, a yB code-word is selected to represent the bit of the additional bit stream, wherein the yB code-word is selected from a group of yB code-words that are used individually to represent the xB word. If a bit from the additional bit stream is not to be multiplexed with the respective xB word, then at block 310, a yB code-word is selected to balance the running disparity, RD, of the encoded bit stream, wherein the yB code-word is selected from a group of yB code-words that are used individually to represent the xB word. After the selection at block 308 or 310 is completed, the process returns to block 302.

According to the 8B/10B encoding scheme of the IEEE 802.3 GbE standard, 72 of the 256 possible 8B words are represented by a single 10B code-word. That is, the 10B code-words in the two categories of 10B code-words are identical. Because it would be impossible to decipher whether a selected 10B code-word is supposed to represent a one or a zero in the above-described multiplexing scheme, in an embodiment of the invention, 8B words that are identified by a single 10B code-word under the given GbE standard are provided with two 10B code-words that are unique to each other and to the rest of the 10B code-words that are utilized in the IEEE 802.3 GbE standard. In an embodiment, one of the two code-words is established as belonging to the category of code-words that tends to exhibit positive DC balance and the other of the two code-words is established as belonging to the category of code-words that tends to exhibit negative DC balance. For example, with reference to the IEEE 802.3 GbE standard, the code group D17.6, with the octet value D1 (110 10001) is identified by the same 10B code-word (100011 0110) regardless of the category from which the code-word is selected. In order for 1's and 0's to be distinguished in the above-described multiplexing scheme, the 8B word should have two different 10B code-words established. In an embodiment, the translation of codes is accomplished with a pre-established translation table. Although the translated code-words are not specified in the IEEE 802.3 GbE standard, the code-words can be used in conjunction with the 8B/10B encoding standard by translating between the native code-words (i.e., the 10B code-words that conform to the given standard) and the translated set of unique 10B code-words. Although the code-word translation scheme is described with reference to 8B/10B encoding in a GbE environment, the code-word translation scheme could be applied to other xB/yB encoding schemes.

Figure 4:
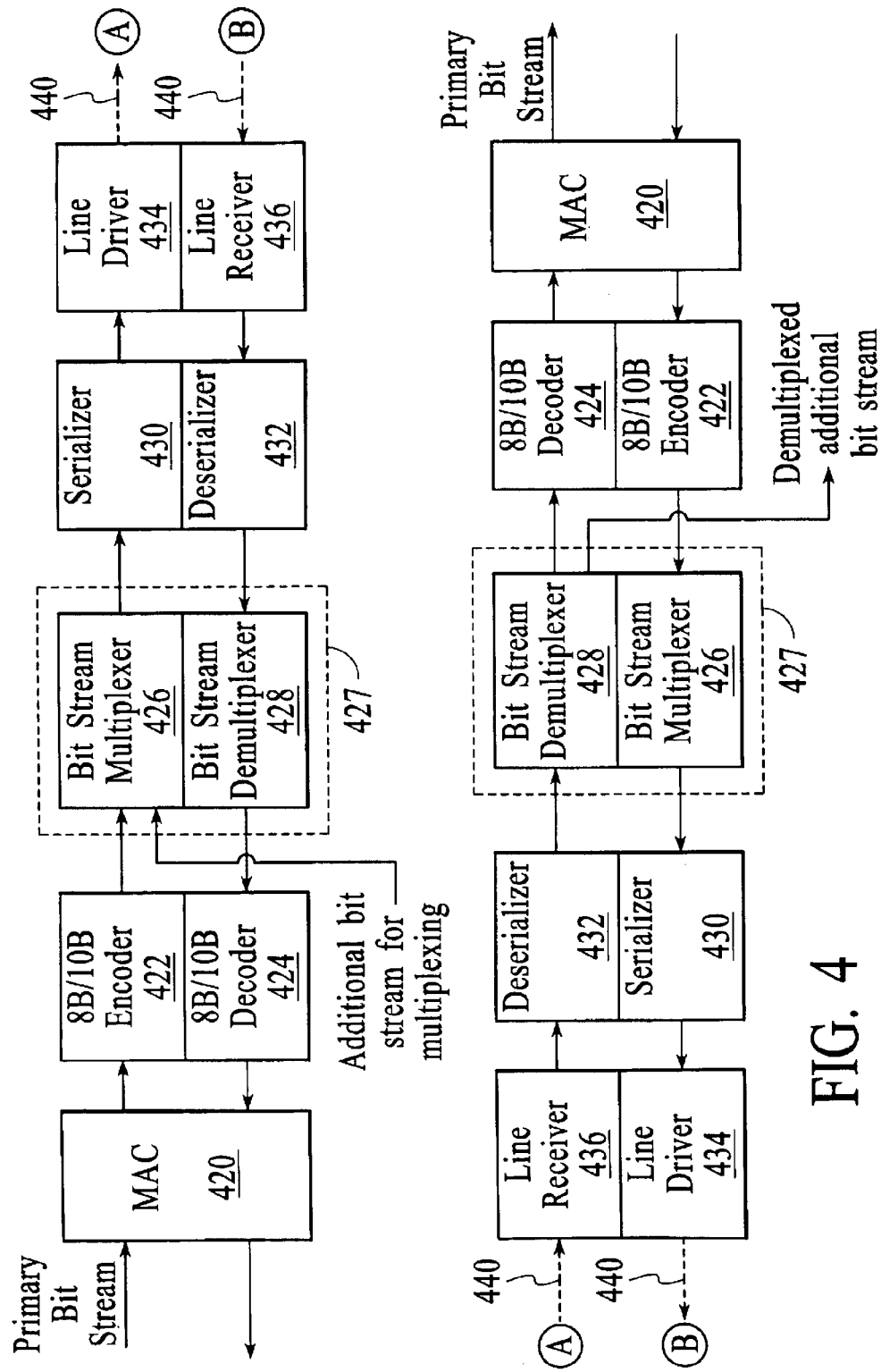
FIG. 4 depicts an example of functional elements that constitute opposite end points in a GbE point-to-point link including functional elements for accomplishing bit stream multiplexing and demultiplexing in accordance with an embodiment of the invention.

In an embodiment, the additional bit stream is multiplexed with the primary bit stream and conveyed across a point-to-point link. FIG. 4 depicts an example of functional elements that constitute opposite end points in a GbE point-to-point link including functional elements for accomplishing bit stream multiplexing and demultiplexing as described above. In the example of FIG. 4, in which an additional bit stream is multiplexed with a GbE primary bit stream, each of the GbE end points includes a media access controller (MAC) 420, an 8B/10B Encoder 422, an 8B/10B Decoder 424, a Bit Stream Multiplexer 426, a Bit Stream Demultiplexer 428, a Serializer 430, a Deserializer 432, a Line Driver 434, and a Line Receiver 436. The two end points in the point-to-point link are often connected by a transmission medium such as optical fiber or copper wire. Throughout the description, similar reference numbers may be used to identify similar elements.

The MACs 420 provide framing, forwarding, and access control logic for packet transmissions between the end points. The functional elements of the two end points are briefly described herein for an example transmission from left to right and from the upper end point to the lower end point as depicted in FIG. 4. On the transmitting end of the point-to-point link (i.e., the upper group of logical elements), the MAC determines if outgoing packets should be sent on the respective port. On the receiving end of the point-to-point link (i.e., the lower group of logical elements), the MAC reads the MAC header of incoming frames and determines if the incoming packets should be forwarded within the receiving device.

On the transmitting end of the point-to-point link, the 8B/10B Encoder 422 encodes 8B words into 10B code-words and the Bit Stream Multiplexer 426 multiplexes the additional bit stream with the primary bit stream. A more detailed description of the Bit Stream Multiplexer and the multiplexing process is provided below. The Serializer 430 converts 10B wide parallel data into 1B wide serial data. The Line Driver 434 converts the 1B wide serial data stream into signals that can be transmitted across the link 440. For example, the Line Driver generates optical signals for transmission over an optical link or electrical signals for transmission over a wire link.

On the receiving end of the point-to-point link, the Line Receiver 436 converts the received signals into an electrical signal format that can be utilized by the subsequent logical elements and outputs 1B wide serial data. The Deserializer 432 converts the 1B wide serial data back into 10B wide parallel data and the Bit Stream Demultiplexer 428 demultiplexes the additional bit stream from the primary bit stream. A more detailed description of the Bit Stream Demultiplexer and the demultiplexing process are provided below. The 8B/10B Decoder 424 decodes the 10B code-words back to the native 8B words and passes the 8B words to the receiving end MAC 420.

Figure 5:
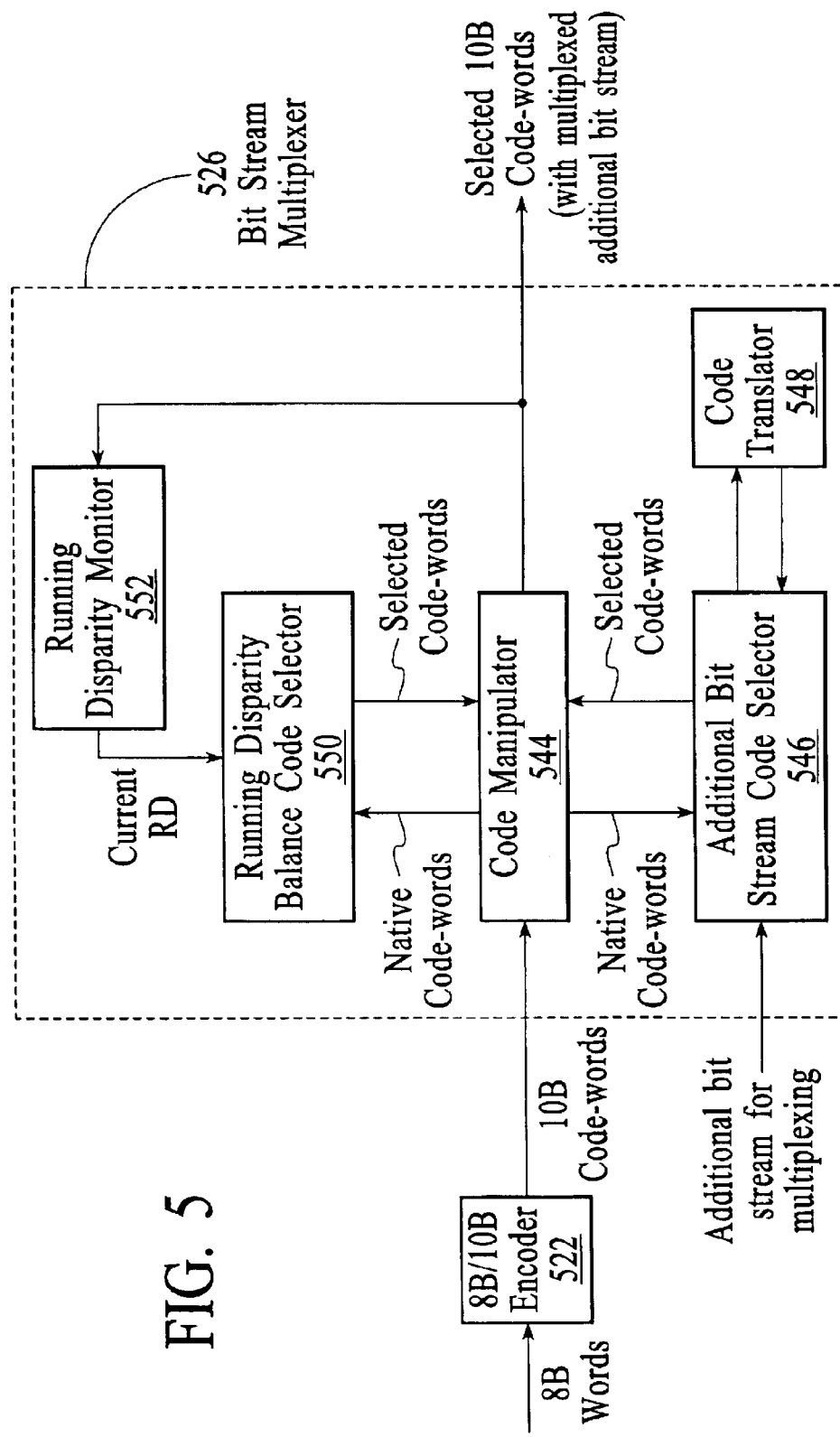
FIG. 5 depicts an expanded view of one of the Bit Stream Multiplexers depicted in FIG. 4.

FIG. 5 depicts an expanded view of one of the Bit Stream Multiplexers depicted in FIG. 4. The Bit Stream Multiplexer 526 depicted in FIG. 5 includes the following functional elements: a Code Manipulator 544, an Additional Bit Stream Code Selector 546, a Code Translator 548, a Running Disparity Balance Code Selector 550, and a Running Disparity Monitor 552. In general, the Bit Stream Multiplexer receives native 10B code-words and an additional bit stream for multiplexing and outputs selected 10B code-words that include the multiplexed additional bit stream. Each functional element of the Bit Stream Multiplexer is described in more detail below.

The Code Manipulator 544 receives native 10B code-words (that is, the original 10B code-words from an 8B/10B Encoder) and determines whether the 10B code-words will be processed via the Additional Bit Stream Code Selector 546 or the Running Disparity Balance Code Selector 550. In an embodiment, the native 10B code-words are received from an 8B/10B Encoder 522, with the 8B/10B Encoder having selected the 10B code-words, according to the given standard, to represent the respective 8B words. The 10B code-words that are used to convey the bits of the additional bit stream are processed by the Additional Bit Stream Code Selector and the 10B code-words that are used to balance the RD are processed by the Running Disparity Balance Code Selector. In an embodiment, the 10B code-words are processed by the two functional elements on an every other 10B code-word interval, however, as noted above, other multiplexing intervals or patterns are possible. Once a 10B code-word has been selected by either the Additional Bit Stream Code Selector or the Running Disparity Balance Code Selector, the Code Manipulator ensures that the output code-word reflects the selected code-word. In an embodiment, the Code Manipulator may include the 8B/10B encoding functions such that the Code Manipulator receives the 8B word stream and outputs the selected 10B code-words.

The Additional Bit Stream Code Selector 546 selects a 10B code-word from the available group of code-words that are used individually to represent the respective 8B word in response to the bit value of the next bit in the additional bit stream. That is, the additional bit stream that is being multiplexed with the primary bit stream dictates which 10B code-word is selected to represent the respective 8B word. In an embodiment, the 10B code-words are selected from the category of code-words that tends to exhibit positive DC balance or from the category of code-words that tends to exhibit negative DC balance. In an embodiment, the code-words in the category that tends to exhibit positive DC balance are selected to represent 1's of the additional bit stream and the code-words in the category that tends to exhibit negative DC balance are selected to represent 0's of the additional bit stream. An indication of the selected code-words is communicated from the Additional Bit Stream Code Selector to the Code Manipulator 544.

The Code Translator 548 manages the translation of 10B code-words in the case of the 8B words that are represented by a single 10B code-word. As described above, according to the IEEE 802.3 GbE standard, 72 of the 256 possible 8B words are represented by a single 10B code-word. When an 8B word is represented by a single 10B code-word, provisions are made to represent the 8B word by at least two different 10B code-words, with one of the 10B code-words belonging to the category of 10B code-words that tends to exhibit positive DC balance and one of the code-words belonging to the category of 10B code-words that tends to exhibit negative DC balance. In the embodiment of FIG. 5, the Code Translator contains all of the translated code-words for the 8B words that are represented by a single 10B code-word according to the IEEE 802.3 GbE standard. When a native 10B code-word that is one of the 72 single-code words is encountered, the Additional Bit Stream Code Selector 546 refers to the Code Translator to determine which translated code-word should be selected to represent the respective bit from the additional bit stream. In an embodiment, the selected code-word is identified by accessing a code translation table that includes the translation rules for all 72 of the 8B words that are represented by a single 10B code-word. An indication of the selected code-word is provided to the Code Manipulator 544 and the selected 10B code-word is output from the Bit Stream Multiplexer 526. The selected 10B code-word conveys a bit from the additional bit stream.

The Running Disparity Balance Code Selector 550 selects 10B code-words from the available group of code-words that are used individually to represent the respective 8B word in response to the current RD. In an embodiment, the 10B code-words are selected to balance the RD of the encoded bit stream. As is known in the field, if the current RD is negative, then a 10B code-word from the category of code-words that tends to exhibit a positive DC balance is selected to represent the respective 8B word and if the current RD is positive, then a 10B code-word from the category of code-words that tends to exhibit a negative DC balance is selected to represent the respective 8B word. The RD balancing rules for GbE are described in the "Clause 36" document that is referred to above.

In the example of FIG. 5, the Running Disparity Balance Code Selector 550 receives an indication of the current RD of the encoded bit stream from the Running Disparity Monitor 552. In an embodiment, the Running Disparity Monitor includes a single bit of information that indicates whether the encoded bit stream is leaning towards too many 1's (positive disparity or RD+) or leaning towards too many 0's (negative disparity or RD−).

Once the Code Manipulator 544 receives an indication of the selected 10B code-word for the respective native 10B code-word, the Code Manipulator ensures that the output 10B code-word reflects the selected 10B code-word. If the selected 10B code-word remains unchanged from the native code-word, then the 10B code-word is forwarded from the Bit Stream Multiplexer 526 as is. If the selected 10B code-word is different than the native code-word, then the selected 10B code-word is generated and output from the Bit Stream Multiplexer. In an embodiment, the selected 10B code-word is generated by manipulating the native 10B code-word. For example, changing the native 10B code-word from one category to the other may involve inverting the bits of the 10B code-word. The selected 10B code-words are output from the Bit Stream Multiplexer to subsequent functional units such as the Serializer.

Figure 6:
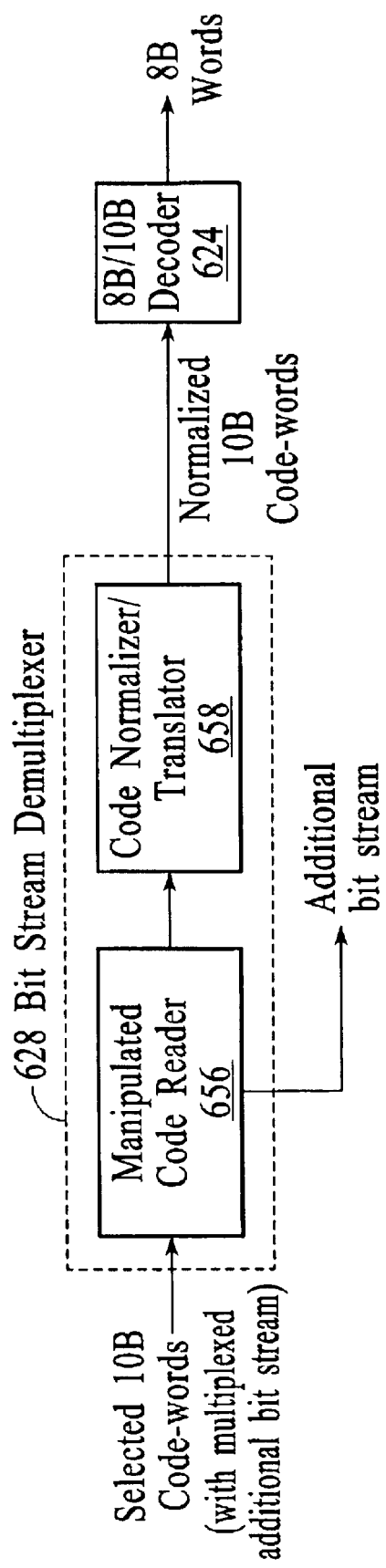
FIG. 6 depicts an expanded view of one of the Bit Stream Demultiplexers depicted in FIG. 4.

FIG. 6 represents an expanded view of one of the Bit Stream Demultiplexers 428 depicted in FIG. 4. The Bit Stream Demultiplexer 628 depicted in FIG. 6 includes the following functional elements: a Manipulated Code Reader 656 and a Code Normalizer/Translator 658. The Manipulated Code Reader reads the multiplexed bit stream by identifying the value of the 10B code-words that carry the multiplexed bits. That is, in the example of FIG. 2, the Manipulated Code Reader reads every other 10B code-word (i.e., sequence numbers 1 and 3) to determine if the manipulated 10B code carries a one or a zero. The code-words from sequence numbers 2 and 4 are disregarded. The determination of whether the manipulated 10B code-words carries a one or a zero involves determining the category to which the 10B code-word belongs. For example, if the 10B code-word belongs to the category of 10B code-words that tends to exhibit positive DC balance, then the 10B code-word carries a "1" and if the 10B code-word belongs to the category of 10B code-words that tends to exhibit negative DC balance, then the 10B code-word carries a "0."

In an embodiment, after reading the 10B code-words to demultiplex the additional bits from the primary bit stream, the manipulated 10B code-words are normalized. That is, all of the 10B code-words that have been changed from the native 10B code-word stream are returned back to their native state. In addition, any 10B code-word that has been translated to a unique 10B code-word is translated back to the 10B code-word that is recognized by the 8B/10B encoding standard. In the embodiment of FIG. 6, normalization and translation is accomplished by the Code Normalizer/Translator 658. The normalized and translated 10B code stream can then be forwarded to the 8B/10B Decoder 624 for decoding to the original 8B code stream.

FIGS. 4–6 depict functional elements for description purposes. It should be understood that these functional elements may or may not be embodied in corresponding distinct physical devices. Specifically, the functional elements may be separate from each other, integrated with each other or any combination thereof. In an embodiment, the functional elements described above are embodied in a combination of hardware and software, however, the functional elements can be embodied primarily in hardware or software. In an embodiment, many of the functional elements of the Bit Stream Multiplexer and the Bit Stream Demultiplexer are embodied in one or more application specific integrated circuits (ASICs) as indicated by dashed boxes 427.

FIG. 7 depicts a table that details the differences between the encoding of a GbE bit stream according to the prior art and the encoding of a GbE bit stream that includes a multiplexed additional bit stream in accordance with an embodiment of the invention. The example described with reference to FIG. 7 involves a primary bit stream, in a GbE environment, that is encoded according to the 8B/10B encoding scheme specified in the IEEE 802.3 GbE standard. In the example, column A identifies a sequence number of 8B words of a primary bit stream and column B identifies the sequence of 8B words of the example GbE bit stream. Column C identifies the byte value of the respective 8B words and column D identifies the code group name for the respective 8B words (as defined by the IEEE 802.3 standard, Clause 36, Physical Coding Sublayer (PCS) and Physical Medium Attachment (PMA) sublayer, type 1000BASE-X). Columns E and F represent the two 10B code-words, according to the IEEE 802.3 GbE standard, for the respective 8B word that is provided in column B. The 10B code-words in column E are identified herein as (+) because they belong to the category of code-words that tends to exhibit a positive DC balance (bias) and the 10B code-words in column F are identified herein as (−) because they belong to the category of code words that tends to exhibit a negative DC balance (bias). It should be noted that the 10B code-words that have an equal number of 1's and 0's actually have a neutral bias. Column G identifies whether the 10B code-words that represent the respective 8B words cause the RD of an encoded bit stream to stay the same (as indicated by an "S") or to flip (as indicated by an "F"). A 10B code-word causes the RD of an encoded bit stream to stay the same if the number 0' and 1's in the 10B code-word is balanced and the 10B code-word causes the RD of the encoded bit stream to flip if the number of 0's and 1's in the 10B code-word is unbalanced. Column H identifies an example current RD that may result from the example primary bit stream of column B. In the example column H, the RD is either positive (+) or negative (−) and it is assumed, for example purposes, that the initial RD is negative (i.e., RD−).

Column I identifies the 10B code-words that are selected to represent the respective 8B word in column B (assuming an initial negative RD), as is known in the prior art where the 10B code-words are selected solely to balance the RD. In accordance with the prior art, the 10B code-word for each 8B word is selected from the two possible code-words in response to the current RD that is depicted in column H. That is, if the current RD in column H is negative (−), then the 10B code-word from column E (the "+" code-word) is selected to represent the 8B word and likewise, if the current RD is positive (+), then the 10B code-word in column F (the "−" code) is selected to represent the 8B word. Column J identifies the RD that results from processing the respective 10B code-words. In the example of FIG. 7, the resulting RD (i.e., column J) for one sequence number is carried over to the current RD (i.e., column H) for the next sequence number. As is known in the field, the current RD is adjusted in response to each new 10B code-word that is processed. Specifically, if the processed 10B code-word is an "S" code-word, then the current RD stays the same upon processing of the 10B code-word and if the 10B code-word is a "F" code-word, then the RD flips from positive to negative or negative to positive upon processing of the 10B code-word. For example, with reference to column H at sequence number 1, the current RD is negative (RD−) and as a result, the 10B code-word from column E is selected. The 10B code-word for sequence number 1 is an "S" and therefore the current RD stays the same (i.e., the RD stays negative). With reference to sequence number 2, the current RD is still negative (RD−) and as a result, the 10B code-word from column E is selected. In contrast to sequence number 1, the 10B code-word for sequence number 2 is an "F" and therefore the current RD flips (i.e., the current RD flips from RD− to RD+).

The multiplexing of an additional bit stream with the primary bit stream of column B is described with reference to columns K, L, M, and N. Specifically, column K represents an example of an additional bit stream that is to be multiplexed with the primary bit stream of column B. In the example, one bit of data is multiplexed with every other 8B word of the column B bit stream. In the example of FIG. 7, one data bit is sent at each of sequence numbers 1, 3, 5, 7, 9, 11, and 13. Column L identifies an example current RD that may result from the multiplexing of the additional bit stream with the primary bit stream, assuming an initial negative RD (RD−). In accordance with an embodiment of the invention, column M represents the 10B code-words that are selected from columns E and F to multiplex the additional bit stream of column K with the primary bit stream of column B. Column N represents the RD of the encoded bit stream given the 10B code-words that are selected in Column M. In the example of FIG. 7, the resulting RD (i.e., column N) for one sequence number is carried over to the current RD (i.e., column L) for the next sequence number.

In the example of FIG. 7, it is assumed that the 10B code-words from column E are used to represent 1's and the 10B code-words from column F are used to represent 0's, although this is implementation specific (i.e., the opposite convention could be used). Referring to columns K and M of sequence number 1, it is desired to multiplex a zero bit (a "low" bit) with the primary bit stream of column B, and therefore the 10B code-word from column F (the category of code-words that tend to exhibit negative DC balance) is selected as the 10B code-word that will be used to represent the respective 8B word. That is, the 10B code-word from column F is selected (instead of the 10B code-word from column E) from the two code-words (columns E and F) in order to represent the desired bit from column K that is being multiplexed with the primary bit stream of column B. In the example, the 10B code-words for the 8B word of sequence number 1 are "S" code-words and therefore the RD stays the same (assuming an initial negative RD, the RD stays negative after the code selection).

Referring now to columns K and M of sequence number 2, no additional bit is being multiplexed with the 8B word from column B, and therefore the selection of the 10B code-word is not made in response to a bit of the additional bit stream. In accordance with an embodiment of the invention, the 10B code-word at sequence number 2 is selected to balance the RD of the encoded bit stream. That is, when the 10B code-word is not used to carry a bit of the additional bit stream, it is used to balance the RD of the encoded bit stream. For example, if the current RD is positive, then a 10B code-word from column F is selected to represent the 8B word and if the current RD is negative, then a 10B code-word from column E is selected to represent the 8B word. In the example of FIG. 7, the current RD at sequence number 2 is negative and therefore the 10B code-word from column E (the "+" code-word) is selected to represent the value of the respective 8B word. In the example, the 10B code-words for the respective 8B word are "F" code-words and therefore the current RD flips from negative (RD−) to positive (RD+). The positive RD is indicated in column N, sequence number 2. The process of selecting the 10B code-words in view of the additional bit stream and the current RD continues as shown in the example of FIG. 7.

As can be seen from the 10B code-word selections identified in columns I and M, the multiplexing of an additional bit stream with the primary bit stream causes the selection of 10B code-words to be altered from the code pattern that is generated without bit multiplexing.

Figure 8:
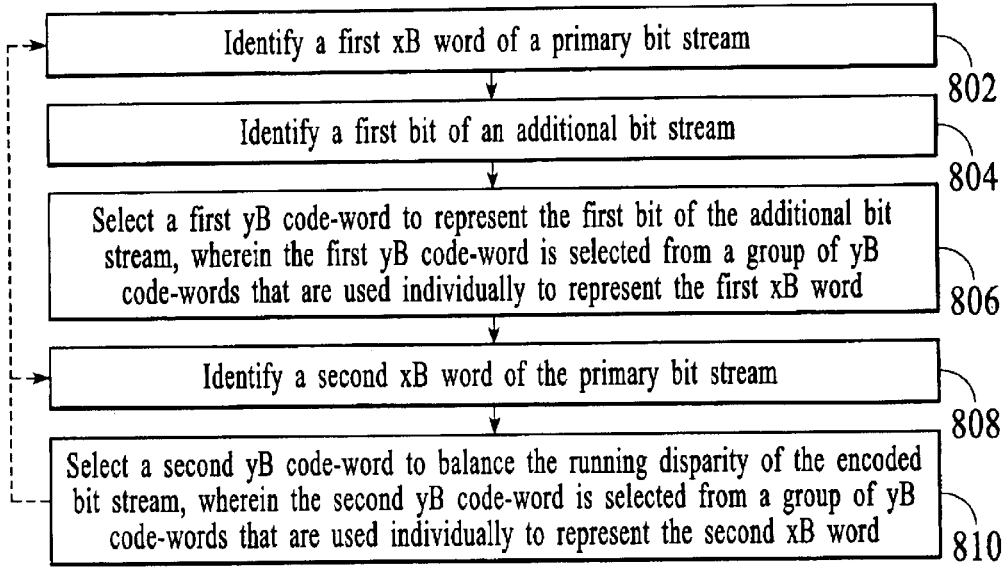
FIG. 8 depicts a process flow diagram of a method for multiplexing an additional bit stream with a primary bit stream in accordance with an embodiment of the invention, where the primary bit stream is encoded into an xB/yB encoded bit stream.

FIG. 8 depicts a process flow diagram of a method for multiplexing an additional bit stream with a primary bit stream in accordance with an embodiment of the invention, where the primary bit stream is encoded into an xB/yB encoded bit stream. At block 802, a first xB word of a primary bit stream is identified. At block 804, a first bit of an additional bit stream is identified. At block 806, a first yB code-word is selected to represent the first bit of the additional bit stream, wherein the first yB code-word is selected from a group of yB code-words that are used individually to represent the first xB word. At block 808, a second xB word of the primary bit stream is identified. At block 810, a second yB code-word is selected to balance the running disparity of the encoded bit stream, wherein the second yB code-word is selected from a group of yB code-words that are used individually to represent the second xB word. The interval of bit multiplexing determines whether the process returns to the top block, 802, or to the intermediate block, 808, as indicated by the dashed return lines.

Figure 9:
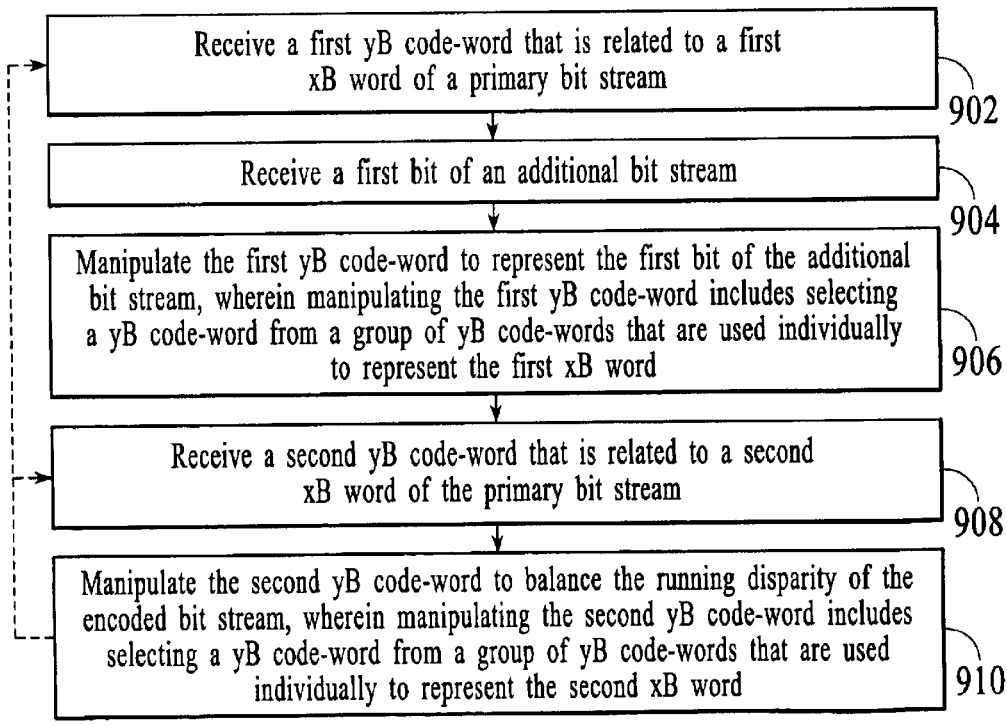
FIG. 9 depicts a process flow diagram of another method for multiplexing an additional bit stream with a primary bit stream in accordance with an embodiment of the invention, where the primary bit stream is encoded into an xB/yB encoded bit stream.

FIG. 9 depicts a process flow diagram of another method for multiplexing an additional bit stream with a primary bit stream in accordance with an embodiment of the invention, where the primary bit stream is encoded into an xB/yB encoded bit stream. At block 902, a first yB code-word that is related to a first xB word of a primary bit stream is received. At block 904, a first bit of an additional bit stream is received. At block 906, the first yB code-word is manipulated to represent the first bit of the additional bit stream, wherein manipulating the first yB code-word includes selecting a yB code-word from a group of yB code-words that are used individually to represent the first xB word. At block 908, a second yB code-word that is related to a second xB word of the primary bit stream is received. At block 910, the second yB code-word is manipulated to balance the running disparity of the encoded bit stream, wherein manipulating the second yB code-word includes selecting a yB code-word from a group of yB code-words that are used individually to represent the second xB word. The interval of bit multiplexing determines whether the process returns to the top block, 902, or to the intermediate block, 908, as indicated by the dashed return lines.

Figure 10:
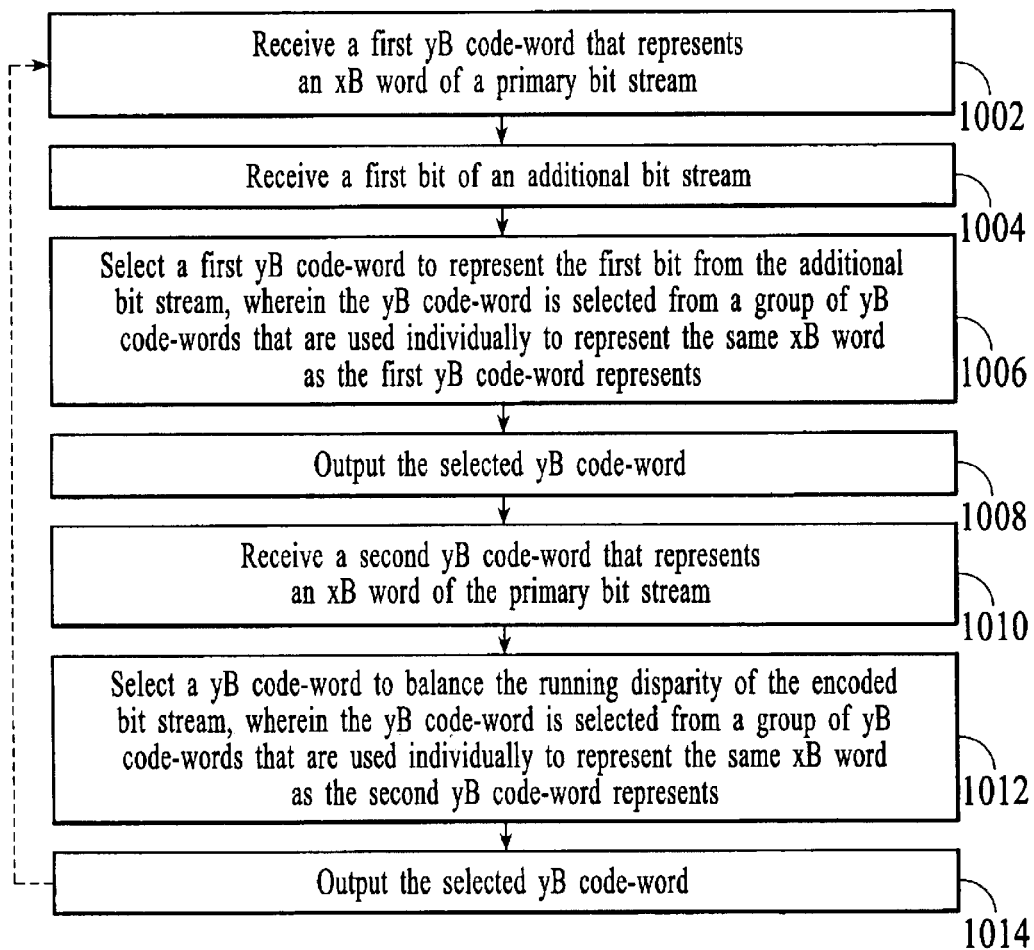
FIG. 10 depicts a process flow diagram of another method for multiplexing an additional bit stream with a primary bit stream in accordance with an embodiment of the invention, where the primary bit stream is encoded into an xB/yB encoded bit stream.

FIG. 10 depicts a process flow diagram of another method for multiplexing an additional bit stream with a primary bit stream in accordance with an embodiment of the invention, where the primary bit stream is encoded into an xB/yB encoded bit stream. At block 1002, a first yB code-word that represents an xB word of a primary bit stream is received. At block 1004, a first bit of an additional bit stream is received. At block 1006, a yB code-word is selected to represent the first bit from the additional bit stream, wherein the yB code-word is selected from a group of yB code-words that are used individually to represent the same xB word as the first yB code-word represents. At block 1008, the selected yB code-word is output. At block 1010, a second yB code-word that represents an xB word of the primary bit stream is received. At block 1012, a yB code-word is selected to balance the running disparity of the encoded bit stream, wherein the yB code-word is selected from a group of yB code-words that are used individually to represent the same xB word as the second yB code-word represents. At block 1014, the selected yB code-word is output. The interval of bit multiplexing determines whether the process returns to the top block, 1002, or to the intermediate block, 1010, as indicated by the dashed return lines.

In some network environments, the primary bit stream is initially encoded in some form other than 8B/10B. For example, a 100M Ethernet bit stream may be encoded into a 4B/5B encoded bit stream (referred to as a qB/rB encoded bit stream). An additional bit stream cannot be multiplexed with the qB/rB encoded bit stream using hardware that is designed to multiplex an additional bit stream with an xB/yB encoded bit stream because the hardware that is designed to multiplex an additional bit stream with an xB/yB encoded bit stream expects to see yB code-words as described above with regard to FIG. 5. In accordance with an embodiment of the invention and in order to be able to multiplex the additional bit stream with a qB/rB encoded bit stream using the same hardware as is used for an xB/yB encoded bit stream, it is desirable to convert a qB/rB encoded bit stream into an xB/yB encoded bit stream before multiplexing takes place. Bits of the additional bit stream are then multiplexed with yB code-words of the xB/yB encoded bit stream. In the particular embodiment that is described in detail below, a 4B/5B encoded bit stream is converted to an 8B/10B encoded bit stream and an additional bit stream is multiplexed with the 10B code-words of the 8B/10B encoded bit stream as described above with regard to FIGS. 2–10. In an embodiment, converting a 4B/5B encoded bit stream to an 8B/10B encoded Ethernet stream involves decoding received 5B code-words to the native 4B words, combing two 4B words to create 8B words, and then encoding the 8B words to 10B code-words.

Figure 11:
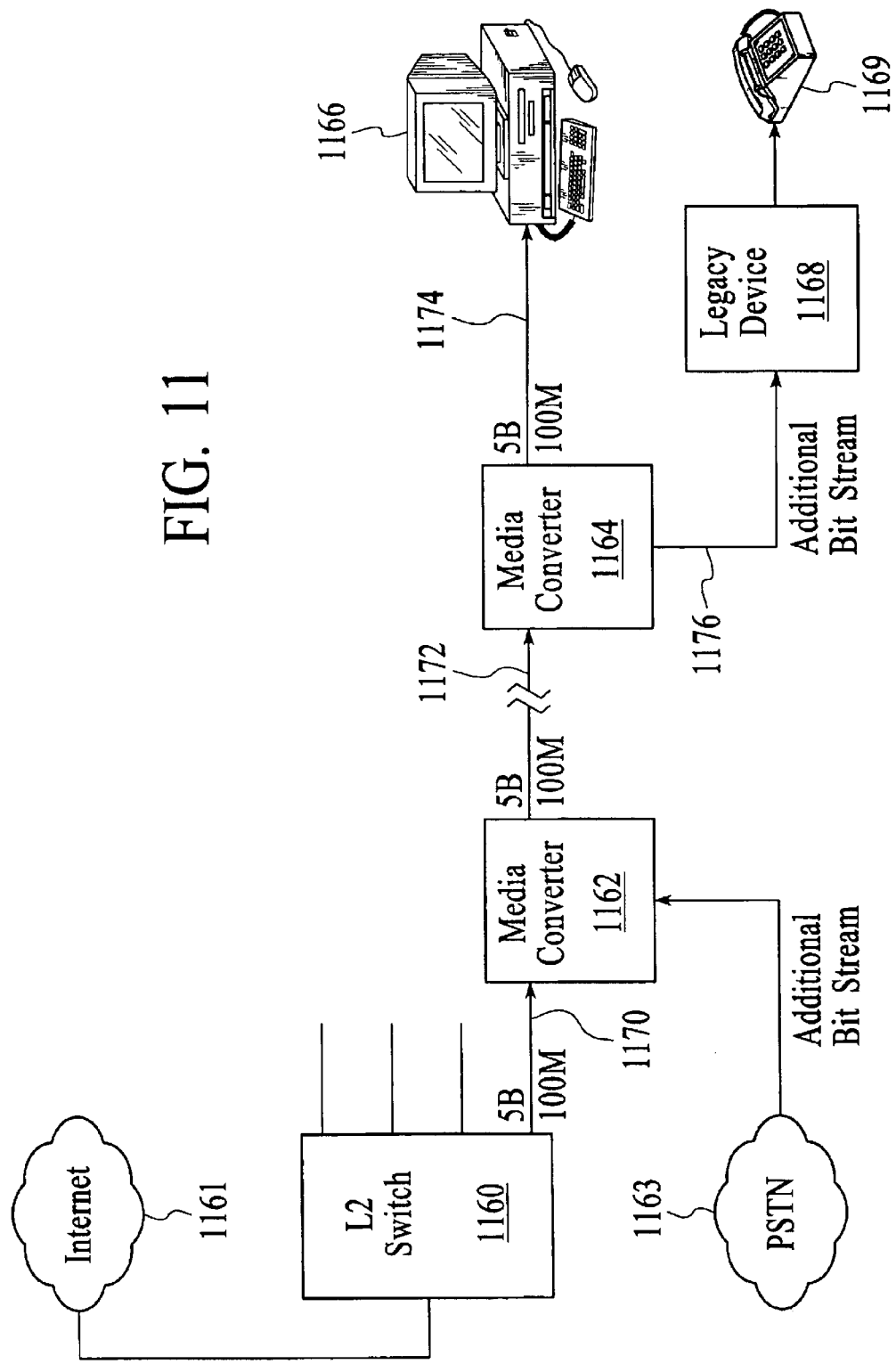
FIG. 11 depicts a network architecture in which media conversion is applied in accordance with an embodiment of the invention.

FIG. 11 depicts a network architecture in which the "media conversion" technique is applied in accordance with an embodiment of the invention. The network architecture of FIG. 11 includes a layer 2 (L2) switch 1160, first and second media converters 1162 and 1164, and end-user devices such as a personal computer 1166 and a legacy device 1168. The L2 switch is a packet-switched device, such as an Ethernet-based switch that forwards traffic based on L2 header information. The L2 switch is typically connected to another network, or networks, such the Internet 1161. Although the L2 switch is described as an Ethernet-based L2 switch, the L2 switch may utilize protocols in addition to or instead of Ethernet to forward traffic. The L2 switch is connected to the first media converter (referred to herein as the plant-side media converter). In the embodiment of FIG. 11, the L2 switch is connected to the media converter by a 100M Ethernet link 1170 and data is transmitted over the link as a 4B/5B encoded bit stream. The media converter is also connected to a communications network, such as a publicly switched telephone network (PSTN) 1163, which communicates with constant bit rate (CBR) traffic. In the embodiment of FIG. 11, an additional bit stream is provided to the media converter from the PSTN.

The plant-side media converter 1162 performs the functions of converting the 4B/5B encoded bit stream to an 8B/10B encoded bit stream and multiplexing bits of an additional bit stream with the 10B code-words of the 8B/10B encoded bit stream. A more detailed description of the plant-side media converter is provided below with reference to FIGS. 12 and 13.

The plant-side media converter 1162 is connected to the second media converter 1164 (referred to herein as the local-side media converter) by a 100M Ethernet link 1172. The 100M Ethernet link carries an 8B/10B encoded bit stream. In an embodiment, the 100M Ethernet link is a fiber optic link (100BASE-FX), although the link could be a wire cable link (100BASE-TX) or some other type of link (e.g., a wireless link). In addition, although a 100M Ethernet link is described, the link could be of some other speed (e.g., 1 GbE or 1000BASE-X) and/or some other protocol.

The local-side media converter 1164 performs the functions of demultiplexing the additional bit stream from the 8B/10B encoded bit stream and converting the 8B/10B encoded bit stream to a 4B/5B encoded bit stream. A more detailed description of the local-side media converter is provided below with reference to FIGS. 14 and 15. In the embodiment of FIG. 1, the local-side media converter is connected to a personal computer 1166 and a legacy device 1168 (e.g., a private branch exchange (PBX)). In an embodiment, the legacy device is a device that communicates using unpacketized CBR data streams (e.g. the additional bit stream). The legacy device is connected to an end-user device, such as a telephone 1169. In other embodiments, the legacy device could be a standalone device or a device connected to other types of end-user devices. A 4B/5B encoded bit stream is communicated between the local-side media converter and the personal computer and the additional bit stream is communicated between the local-side media converter and the legacy device although other end-user devices may be connected to the local-side media converter in addition to or instead of the personal computer and the legacy device. In the embodiment of FIG. 11, the link 1174 between the local-side media converter and the personal computer is a packet-based link that utilizes 100M Ethernet and 4B/5B encoding although a different type of link could be utilized. The link 1176 between the local-side media converter and the legacy device is a CBR link that utilizes time division multiplexing (TDM) although a different type of link could be utilized.

The plant-side and local-side media converters 1162 and 1164 are described below with regard to data streams that flow from the L2 switch 1160 to the end-user devices 1166 and 1168. Under this convention, the plant-side media converter represents the transmission side of the link and the local-side media converter represents the receiver side of the link. Similar processes are performed in the reverse order for data streams that flow from the end-user devices to the plant-side media converter.

Figure 12:
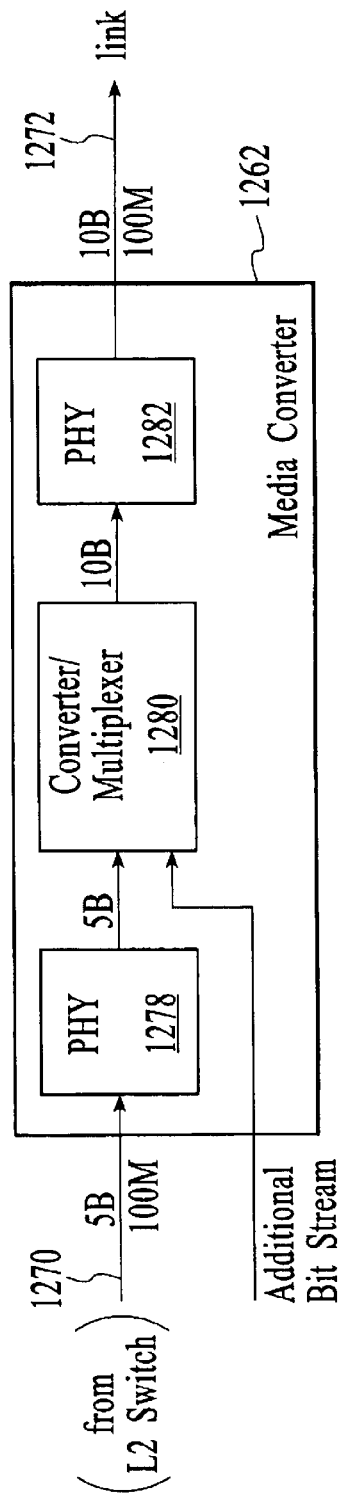
FIG. 12 depicts an expanded view of the plant-side media converter from FIG. 11.

FIG. 12 depicts an expanded view of an example of the plant-side media converter 1162 from FIG. 11. The plant-side media converter 1262 includes a plant-side physical interface module (PHY) 1278, a converter/multiplexer 1280, and a local-side PHY 1282. The plant-side PHY receives a 4B/5B encoded bit stream (e.g., 100M Ethernet) from the L2 switch. The plant-side PHY converts the received signals of the 4B/5B encoded bit stream into signals that can be manipulated by the plant-side media converter. The plant-side PHY passes 5B code-words to the converter/multiplexer.

Figure 13:
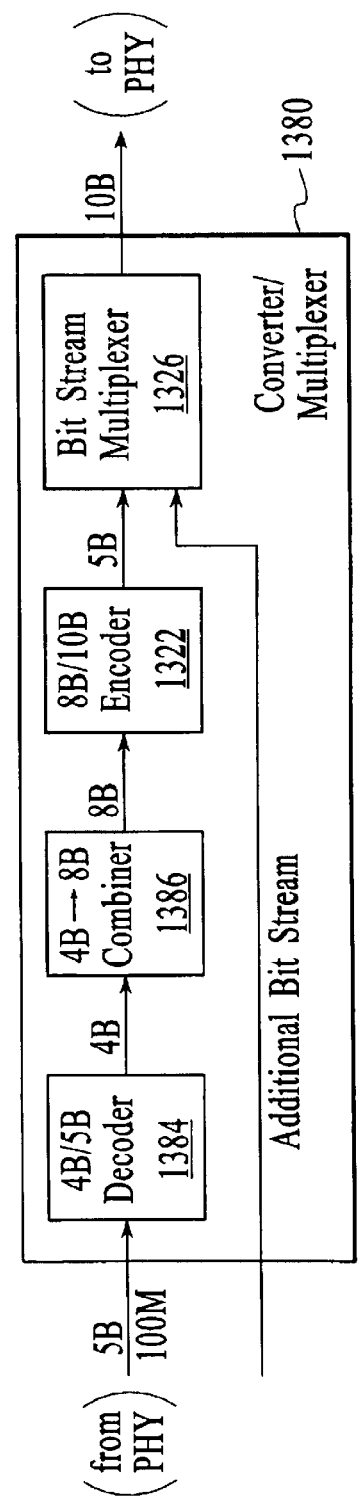
FIG. 13 depicts an expanded view of the converter/multiplexer from FIG. 12.

The converter/multiplexer 1280 performs the function of converting a stream of 5B code-words into a stream of 10B code-words and multiplexing the additional bit stream with the stream of 10B code-words. As depicted in FIG. 12, the converter/multiplexer receives 5B code-words from the plant-side PHY 1278 and the additional bit stream from an additional bit stream source. An expanded view of an embodiment of the converter/multiplexer is depicted in FIG. 13. The converter/multiplexer 1380 depicted in FIG. 13 includes a 4B/5B decoder 1384, a 4B/8B combiner 1386, an 8B/10B encoder 1322, and a bit stream multiplexer 1326. The 4B/5B decoder receives 5B code-words of the 4B/5B encoded bit stream and decodes the 5B code-words into the native 4B words. In an embodiment, the 5B code-words are decoded using standard 100M Ethernet decoding techniques. A stream of 4B words is output from the 4B/5B decoder.

The 4B/8B combiner 1386 receives the stream of 4B words from the 4B/5B decoder 1384 and combines the 4B words into 8B words. In an embodiment, the 4B/8B combiner is implemented as a shift register that combines two consecutive 4B words into a single 8B word. A stream of 8B words is output from the 4B/8B combiner.

The 8B/10B encoder 1322 receives the stream of 8B words from the 4B/8B combiner. The 8B/10B encoder encodes the 8B words into 10B code-words as described above with reference to FIGS. 4 and 5. For example, the 8B words are encoded using the 8B/10B encoding scheme of the IEEE 802.3 GbE standard. A stream of 10B code-words is output from the 8B/10B encoder.

The bit stream multiplexer 1326 receives the stream of 10B code-words from the 8B/10B encoder 1322 and an additional bit stream from an additional bit stream source such as a PSTN. The bit stream multiplexer multiplexes the additional bit stream with the stream of 10B code-words (i.e., the primary bit stream) using the techniques described above with reference to FIGS. 2–10. A stream of 10B code-words that have been selected to carry the additional bit stream is output from the bit stream multiplexer. After the conversion and multiplexing processes, the converter/multiplexer passes 10B code-words to the local-side PHY 1282.

Referring back to FIG. 12, the local-side PHY 1282 converts the 10B code-words into signals that are compatible with the communications link 1272. In an embodiment, the local-side PHY supports a 100M Ethernet link that transmits data in 10B code-words. As stated above, the link could alternatively be a 1 GbE link or some other type of link.

Figure 14:
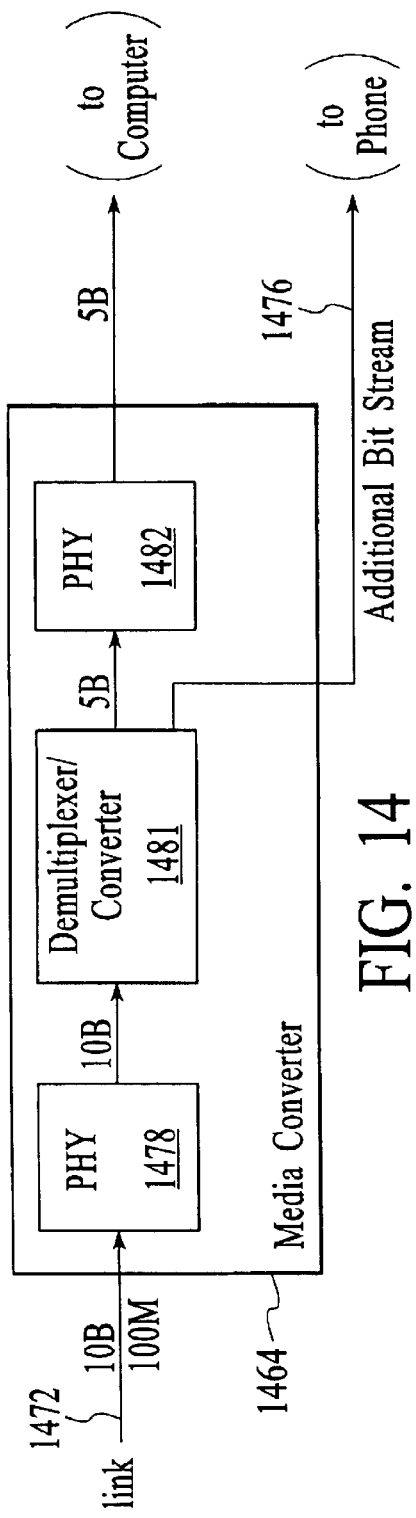
FIG. 14 depicts an expanded view of the local-side media converter from FIG. 11.

Referring back to FIG. 11, once transmitted across the link 1172, the stream of 10B code-words is received at the local-side media converter 1164. FIG. 14 depicts an expanded view of and example of the local-side media converter from FIG. 11. The local-side media converter 1464 includes a plant-side PHY 1478, a demultiplexer/converter 1481, and a local-side PHY 1482. The plant-side PHY receives signals carrying the 10B code-words from the plant-side media converter. The plant-side PHY converts the received signals into signals that can be manipulated by the local-side media converter. The plant-side PHY passes the 10B code-words to the demultiplexer/converter.

Figure 15:
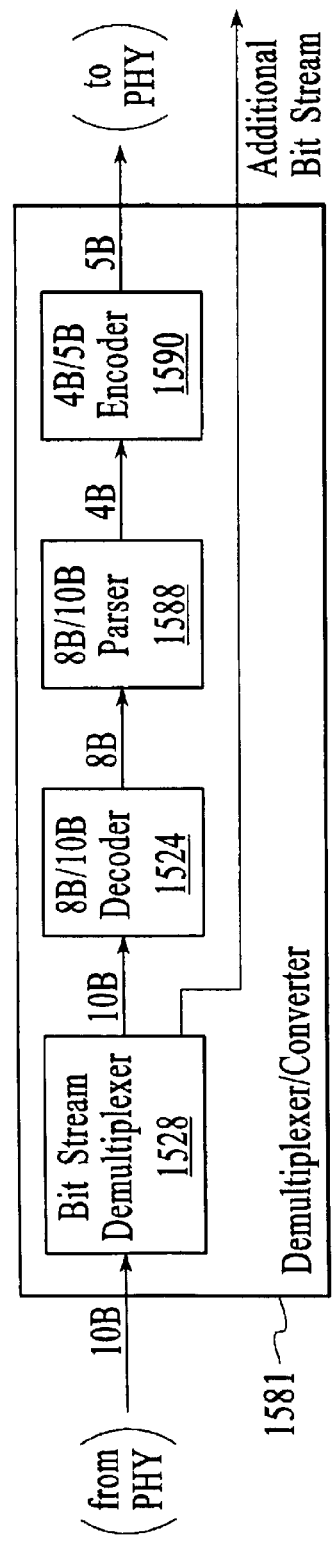
FIG. 15 depicts an expanded view of the demultiplexer/converter from FIG. 14.

The demultiplexer/converter 1481 performs the function of demultiplexing the additional bit stream from the 10B code-words and converting the 10B code-words to 5B code-words. As depicted in FIG. 14, the demultiplexer/converter receives 10B code-words from the plant-side PHY 1478. The 10B code-words carry the multiplexed additional bit stream as described above with reference to FIGS. 2–10. An expanded view of an embodiment of the demultiplexer/converter is depicted in FIG. 15. The demultiplexer/converter 1581 depicted in FIG. 15 includes a bit stream demultiplexer 1528, an 8B/10B decoder 1524, an 8B/4B parser 1588, and a 4B/5B encoder 1590. The bit stream demultiplexer receives 10B code-words from the plant-side PHY 1478. The bit stream demultiplexer demultiplexes the additional bit stream from the 10B code-words using the techniques that are described above with reference to FIGS. 2–10. A stream of 10B code-words and the additional bit stream are output from the bit stream multiplexer. In the embodiment of FIG. 15, the output 10B code-words are the normalized 10B code-words as described above with reference to FIG. 6.

The 8B/10B decoder 1524 decodes the 10B code-words into the native 8B words. The 8B/10B decoder is similar to the 8B/10B decoder 624 described above with reference to FIG. 6. After decoding, a stream of 8B words is output from the 8B/10B decoder.

The 8B/4B parser 1588 receives the 8B words from the 8B/10B decoder and divides the 8B words into 4B words. In an embodiment, 8B/4B parsing is accomplished with a shift register that divides each 8B word into two 4B words. A stream of 4B words is output from the 8B/4B parser.

The 4B/5B encoder 1590 encodes native 4B words into 5B code-words. In the embodiment of FIG. 15, the 4B/5B encoder uses standard 100M Ethernet encoding as specified by the IEEE 802.3 standard. A stream of 5B code-words is output from the 4B/5B encoder. Referring back to FIG. 14, after the demultiplexing and conversion processes, the demultiplexer/converter 1481 passes 5B code-words to the local-side PHY 1482 and the additional bit stream to an end-user device such as a telephone.

Although the technique of converting and multiplexing/demultiplexing is described with regard to a 4B/5B encoded bit stream and an 8B/10B encoded bit stream, the technique could be applied to another combination of qB/rB and xB/yB encoded bit streams. Although the technique of converting and multiplexing/demultiplexing is described herein in a single direction, the processes can be performed in the other direction to create bidirectional functionality. In addition, although FIGS. 12–15 depict distinct functional elements, these functional elements could be integrated onto the same ASIC.

Figure 16:
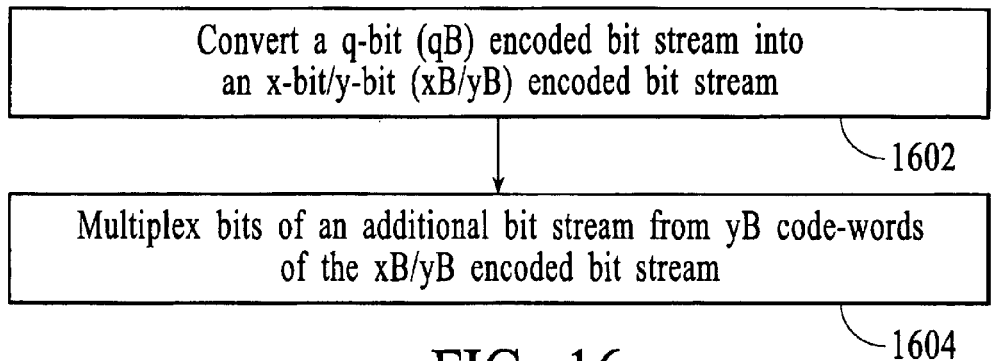
FIG. 16 is a process flow diagram of a method for managing a primary bit stream and an additional bit stream in accordance with an embodiment of the invention.

FIG. 16 is a process flow diagram of a method for managing a primary bit stream and an additional bit stream in accordance with an embodiment of the invention. At step 1602, a q-bit/r-bit (qB/rB) encoded bit stream is converted into an x-bit/y-bit (xB/yB) encoded bit stream. At step 1604, bits of an additional bit stream are multiplexed with yB code-words of the xB/yB encoded bit stream.

Figure 17:
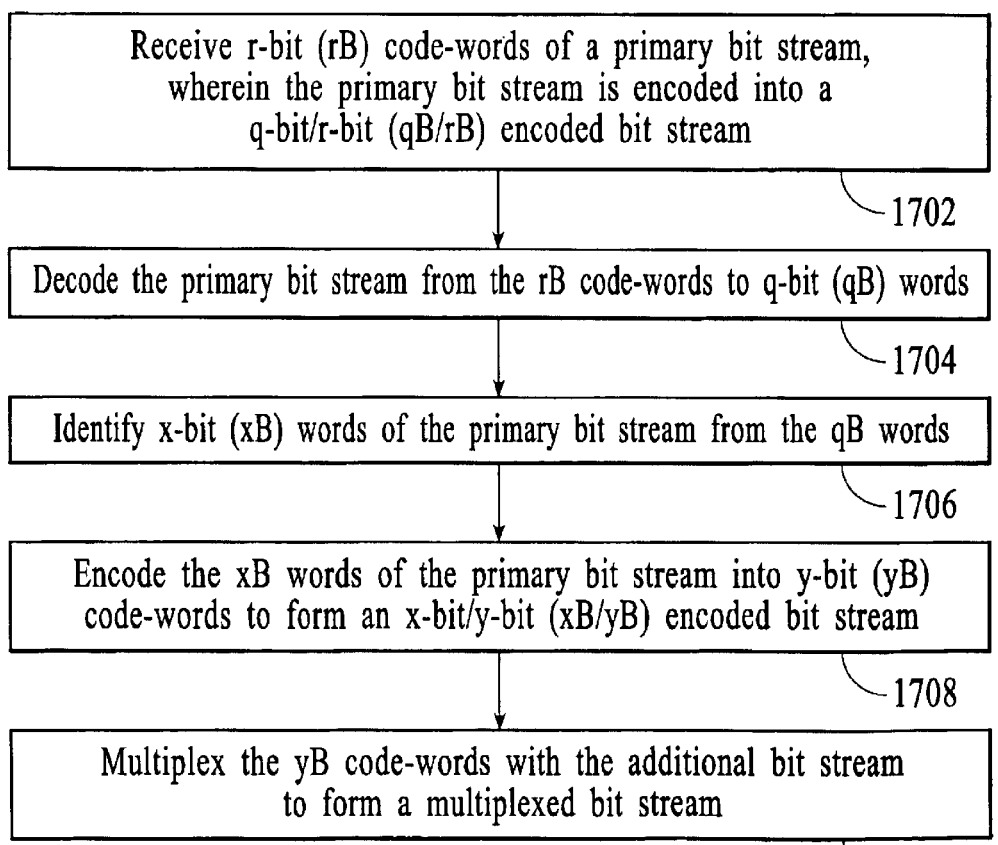
FIG. 17 is a process flow diagram of a method for managing a primary bit stream and an additional bit stream in accordance with another embodiment of the invention.

FIG. 17 is a process flow diagram of a method for managing a primary bit stream and an additional bit stream in accordance with another embodiment of the invention. At step 1702, r-bit (rB) code-words of a primary bit stream are received, wherein the primary bit stream is encoded into a q-bit/r-bit (qB/rB) encoded bit stream. At step 1704, the primary bit stream is decoded from the rB code-words to q-bit (qB) words. At step 1706, x-bit (xB) words of the primary bit stream are identified from the qB words. At step 1708, the xB words of the primary bit stream are encoded into y-bit (yB) code-words to form an x-bit/y-bit (xB/yB) encoded bit stream. At step 1710, the yB code-words are multiplexed with the additional bit stream to form a multiplexed bit stream.

Figure 18:
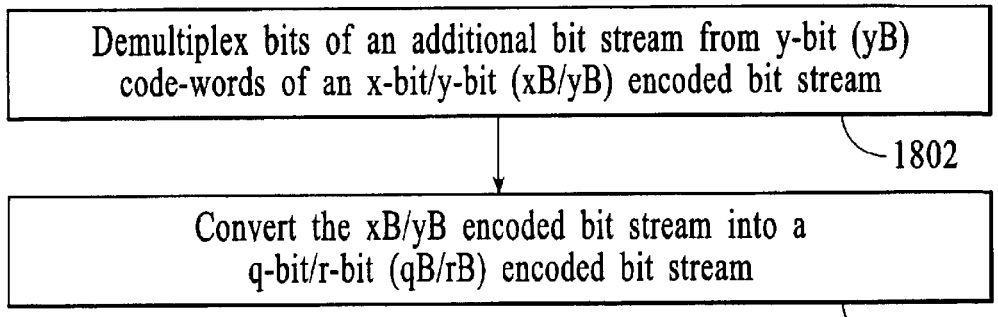
FIG. 18 is a process flow diagram of a method for managing a primary bit stream and an additional bit stream in accordance with an embodiment of the invention.

FIG. 18 is a process flow diagram of a method for managing a primary bit stream and an additional bit stream in accordance with another embodiment of the invention. At step 1802, bits of an additional bit stream are demultiplexed from y-bit (yB) code-words of an x-bit/y-bit (xB/yB) encoded bit stream. At step 1804, the xB/yB encoded bit stream is converted into a q-bit/r-bit (qB/rB) encoded bit stream.

Figure 19:
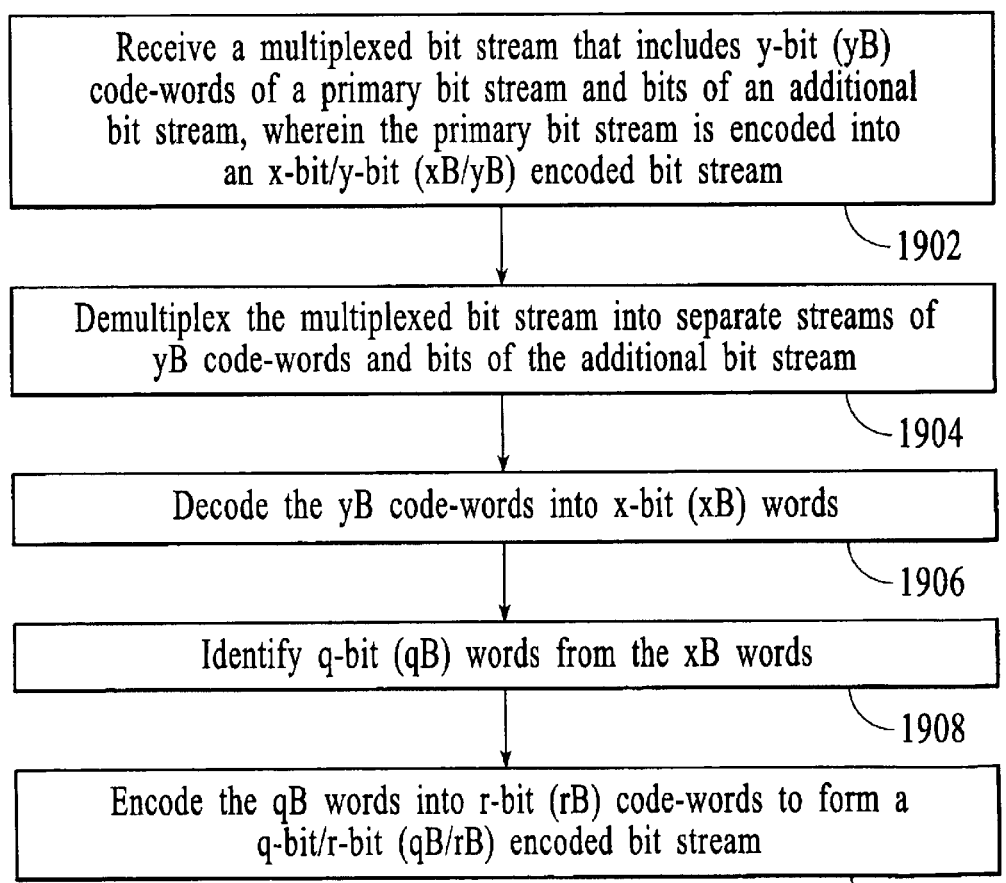
FIG. 19 is a process flow diagram of a method for managing a primary bit stream and an additional bit stream in accordance with another embodiment of the invention.

FIG. 19 is a process flow diagram of a method for managing a primary bit stream and an additional bit stream in accordance with another embodiment of the invention. At step 1902, a multiplexed bit stream that includes y-bit (yB) code-words of a primary bit stream and bits of an additional bit stream is received, wherein the primary bit stream is encoded into an x-bit/y-bit (xB/yB) encoded bit stream. At step 1904, the multiplexed bit stream is demultiplexed into separate streams of yB code-words and bits of the additional bit stream. At step 1906, the yB code-words are decoded into x-bit (xB) words. At step 1908, q-bit (qB) words are identified from the xB words. At step 1910, the qB words are encoded into r-bit (rB) code-words to form a q-bit/r-bit (qB/rB) encoded bit stream.

Although specific embodiments of the invention have been described and illustrated, the invention is not to be limited to the specific forms or arrangements of parts as described and illustrated herein. The invention is limited only by the claims.

What is claimed is:

1. A method for managing a primary bit stream and an additional bit stream comprising:

converting a q-bit/r-bit (qB/rB) encoded bit stream into an x-bit/y-bit (xB/yB) encoded bit stream; and multiplexing bits of said additional bit stream with yB code-words of said xB/yB encoded bit stream.

2. The method of claim 1 wherein converting a qB/rB encoded bit stream into an xB/yB encoded bit stream includes:

receiving rB code-words of said qB/rB encoded bit stream;

decoding said rB code-words to qB words;

identifying xB words from said qB words; and encoding said xB words into yB code-words.

3. The method of claim 1 wherein multiplexing said yB code-words with said additional bit stream includes:

identifying a yB code-word, said yB code-word being related to a particular xB word of said xB/yB encoded bit stream;

identifying a bit of said additional bit stream; and selecting a yB code-word to represent said bit of said additional bit stream, wherein said yB code-word is selected from a group of yB code-words that are used individually to represent said particular xB word.

4. The method of claim 3 wherein multiplexing bits of said additional bit stream with yB code-words further includes:

identifying another yB code-word, said another yB code-word being related to another xB word of said xB/yB encoded bit stream; and selecting a yB code-word in response to a DC balance characteristic of said xB/yB encoded bit stream, wherein said yB code-word is selected from a group of yB code-words that are used individually to represent said another xB word.

5. The method of claim 3 wherein each group of yB code-words includes at least one yB code-word that belongs to a category of yB code-words that tends to exhibit positive DC balance and at least one yB code-word that belongs to a category of yB code-words that tends to exhibit negative DC balance.

6. The method of claim 5 wherein yB code-words from said category of yB code-words that tends to exhibit positive DC balance are used to represent one bits and wherein yB code-words from said category of yB code-words that tends to exhibit negative DC balance are used represent zero bits.

7. The method of claim 3 wherein one yB code-word, from said group of yB code-words that are used individually to represent said xB word, represents a high bit and another yB code-word, from said group of yB code-words that are used individually to represent said xB word, represents a low bit.

8. The method of claim 1 further including transmitting said multiplexed bit stream across a network link.

9. The method of claim 8 further including receiving said yB code-words, and demultiplexing bits of said additional bit stream from said yB code-words.

10. The method of claim 9 wherein demultiplexing includes identifying said yB code-words as belonging to a category of code-words that tends to exhibit positive DC balance or a category of code-words that tends to exhibit negative DC balance.

11. The method of claim 1 wherein said qB/rB encoded bit stream is a 4B/5B encoded bit stream and said xB/yB encoded bit stream is an 8B/10B encoded bit stream.

12. The method of claim 11 wherein said 4B/5B encoding and said 8B/10B encoding are defined by the IEEE 802.3 standard.

13. The method of claim 2 wherein identifying xB words of said primary bit stream from said qB words includes combining multiple qB words to form said xB words.

14. The method of claim 3 wherein said step of selecting said yB code-word includes selecting from a translated set of unique yB code-words when said xB word is represented, according to a known xB/yB encoding standard, by a single yB code-word.

15. The method of claim 14 wherein said known xB/yB encoding standard is defined by the IEEE 802.3 standard.

16. A method for managing a primary bit stream and an additional bit stream comprising:

receiving r-bit (rB) code-words of said primary bit stream, wherein said primary bit stream is encoded into a q-bit/r-bit (qB/rB) encoded bit stream;

decoding said primary bit stream from said rB code-words to q-bit (qB) words;

identifying x-bit (xB) words of said primary bit stream from said qB words;

encoding said xB words of said primary bit stream into y-bit (yB) code-words to form an x-bit/y-bit (xB/yB) encoded bit stream; and multiplexing said yB code-words with said additional bit stream to form a multiplexed bit stream.

17. The method of claim 16 wherein multiplexing said yB code-words with said additional bit stream includes:

identifying a yB code-word of said primary bit stream, said yB code-word being related to a particular xB word of said primary bit stream;

identifying a bit of said additional bit stream; and selecting a yB code-word to represent said bit of said additional bit stream, wherein said yB code-word is selected from a group of yB code-words that are used individually to represent said particular xB word.

18. The method of claim 17 wherein multiplexing said yB code-words with said additional bit stream further includes:

identifying another yB code-word of said primary bit stream, said another yB code-word being related to another xB word of said primary bit stream; and selecting a yB code-word in response to a DC balance characteristic of said xB/yB encoded bit stream, wherein said yB code-word is selected from a group of yB code-words that are used individually to represent said another xB word.

19. The method of claim 17 wherein each group of yB code-words includes at least one yB code-word that belongs to a category of yB code-words that tends to exhibit positive DC balance and at least one yB code-word that belongs to a category of yB code-words that tends to exhibit negative DC balance.

20. The method of claim 19 wherein yB code-words from said category of yB code-words that tends to exhibit positive DC balance are used to represent one bits and wherein yB code-words from said category of yB code-words that tends to exhibit negative DC balance are used represent zero bits.

21. The method of claim 17 wherein one yB code-word, from said group of yB code-words that are used individually to represent said xB word, represents a high bit and another yB code-word, from said group of yB code-words that are used individually to represent said xB word, represents a low bit.

22. The method of claim 16 further including transmitting said multiplexed bit stream across a network link.

23. The method of claim 22 further including receiving a yB code-word of said multiplexed bit stream, and demultiplexing said bit of said additional bit stream from said yB code-word.

24. The method of claim 23 wherein demultiplexing includes identifying said yB code-word as belonging to a category of code-words that tends to exhibit positive DC balance or a category of code-words that tends to exhibit negative DC balance.

25. The method of claim 16 wherein said qB/rB encoded bit stream is a 4B/5B encoded bit stream and said xB/yB encoded bit stream is an 8B/10B encoded bit stream.

26. The method of claim 25 wherein said 4B/5B encoding and said 8B/10B encoding are defined by the IEEE 802.3 standard.

27. The method of claim 16 wherein identifying xB words of said primary bit stream from said qB words includes combining multiple qB words to form said xB words.

28. The method of claim 17 wherein said step of selecting said yB code-word includes selecting from a translated set of unique yB code-words when said xB word is represented, according to a known xB/yB encoding standard, by a single yB code-word.

29. The method of claim 28 wherein said known xB/yB encoding standard is defined by the IEEE 802.3 standard.

30. A method for managing a primary bit stream and an additional bit stream comprising:
 demultiplexing bits of said additional bit stream from y-bit (yB) code-words of an x-bit/y-bit (xB/yB) encoded bit stream; and
 converting said xB/yB encoded bit stream into a q-bit/r-bit (qB/rB) encoded bit stream.

31. The method of claim 30 wherein converting said xB/yB encoded bit stream into a qB/rB encoded bit stream includes:
 decoding said yB code-words into xB words;
 identifying qB words from said xB words; and
 encoding said qB words into rB code-words.

32. The method of claim 30 wherein demultiplexing includes identifying said yB code-words as belonging to a category of code-words that tends to exhibit positive DC balance or a category of code-words that tends to exhibit negative DC balance.

33. The method of claim 32 wherein yB code-words belonging to said category of code-words that tends to exhibit positive DC balance represent one of high bits and low bits and yB code-words belonging to said category of code-words that tends to exhibit negative DC balance represent one of high bits and low bits, wherein only one of said two categories represents high bits and the other one of said two categories represents low bits.

34. The method of claim 30 wherein said qB/rB encoded bit stream is a 4B/5B encoded bit stream and said xB/yB encoded bits stream is an 8B/10B encoded bit stream.

35. The method of claim 34 wherein said 4B/5B encoding and said 8B/10B encoding are defined by the IEEE 802.3 standard.

36. A method for managing a primary bit stream and an additional bit stream comprising:
 receiving a multiplexed bit stream that includes y-bit (yB) code-words of said primary bit stream and bits of said additional bit stream, wherein said primary bit stream is encoded into an x-bit/y-bit (xB/yB) encoded bit stream;
 demultiplexing said multiplexed bit stream into separate streams of yB code-words and bits of said additional bit stream;
 decoding said yB code-words into x-bit (xB) words;
 identifying q-bit (qB) words from said xB words;
 encoding said qB words into r-bit (rB) code-words to form a q-bit/r-bit (qB/rB) encoded bit stream.

37. The method of claim 36 wherein demultiplexing includes identifying said yB code-words as belonging to a category of code-words that tends to exhibit positive DC balance or a category of code-words that tends to exhibit negative DC balance.

38. The method of claim 37 wherein yB code-words belonging to said category of code-words that tends to exhibit positive DC balance represent one of high bits and low bits and yB code-words belonging to said category of code-words that tends to exhibit negative DC balance represent one of high bits and low bits, wherein only one of said two categories represents high bits and the other one of said two categories represents low bits.

39. The method of claim 36 wherein said qB/rB encoded bit stream is a 4B/5B encoded bit stream and said xB/yB encoded bits stream is an 8B/10B encoded bit stream.

40. The method of claim 39 wherein said 4B/5B encoding and said 8B/10B encoding are defined by the IEEE 802.3 standard.

41. A system for managing a primary bit stream and an additional bit stream comprising:
 means for converting a q-bit/r-bit (qB/rB) encoded bit stream into an x-bit/y-bit (xB/yB) encoded bit stream; and
 means for multiplexing said additional bit stream with said xB/yB encoded bit stream, said multiplexing resulting in a multiplexed bit stream.

42. The system of claim 41 wherein said means for converting includes means for:
 receiving rB code-words of said qB/rB encoded bit stream;
 decoding said rB code-words to qB words;
 identifying xB words from said qB words; and
 encoding said xB words into yB code-words.

43. The system of claim 41 wherein said means for multiplexing includes:
 a first input for receiving a first yB code-word that is related to a first xB word of said primary bit stream and for receiving a second yB code-word that is related to a second xB word of said primary bit stream;
 a second input for receiving a first bit of said additional bit stream; and
 means for manipulating said first yB code-word to represent said first bit of said additional bit stream, wherein manipulating said first yB code-word includes selecting a yB code-word from a group of yB code-words that are used individually to represent said first xB word, and for manipulating said second yB code-word to balance the running disparity of said encoded bit stream, wherein manipulating said second yB code-word includes selecting a yB code-word from a group of yB code-words that are used individually to represent said second xB word.

44. The system of claim 43 wherein each group of yB code-words includes at least one yB code-word that belongs to a category of yB code-words that tends to exhibit positive DC balance and at least one yB code-word that belongs to a category of yB code-words that tends to exhibit negative DC balance.

45. The system of claim 44 wherein yB code-words from said category of yB code-words that tends to exhibit positive DC balance are used to represent one bits and wherein yB code-words from said category of yB code-words that tends to exhibit negative DC balance are used represent zero bits.

46. The system of claim 43 wherein one yB code-word, from said group of yB code-words that are used individually to represent said first xB word, represents a high bit and another yB code-word, from said group of yB code-words that are used individually to represent said first xB word, represents a low bit.

47. The system of claim 41 further including means for demultiplexing said first bit of said additional bit stream from said first yB code-word.

48. The system of claim 47 wherein said means for demultiplexing includes means for identifying said first yB code-word as belonging to a category of code-words that tends to exhibit positive DC balance or a category of code-words that tends to exhibit negative DC balance.

49. The system of claim 41 wherein said qB/rB encoding is 4B/5B encoding and said xB/yB encoding is 8B/10B encoding.

50. The system of claim 49 wherein said 4B/5B encoding and said 8B/10B encoding is defined by the IEEE 802.3 standard.

51. The system of claim 43 wherein manipulating said first yB code-word includes selecting from a translated set of unique yB code-words when said first xB word is represented, according to a known xB/yB encoding standard, by a single yB code-word.

52. The method of claim 51 wherein said known xB/yB encoding standard is defined by the IEEE 802.3 standard.

53. A system for managing a primary bit stream and an additional bit stream comprising:

means for demultiplexing bits of said additional bit stream from y-bit (yB) code-words of an x-bit/y-bit (xB/yB) encoded bit stream; and means for converting said xB/yB encoded bit stream into a q-bit/r-bit (qB/rB) encoded bit stream.

54. The system of claim 53 wherein said converting means includes means for:

decoding said yB code-words into xB words;

identifying qB words from said xB words; and encoding said qB words into rB code-words.

55. The system of claim 53 wherein said means for demultiplexing includes means for identifying said yB code-words as belonging to a category of code-words that tends to exhibit positive DC balance or a category of code-words that tends to exhibit negative DC balance.

56. The system of claim 55 wherein yB code-words belonging to said category of code-words that tends to exhibit positive DC balance represent one of high bits and low bits and yB code-words belonging to said category of code-words that tends to exhibit negative DC balance represent one of high bits and low bits, wherein only one of said two categories represents high bits and the other one of said two categories represents low bits.

57. The system of claim 53 wherein said qB/rB encoded bit stream is a 4B/5B encoded bit stream and said xB/yB encoded bits stream is an 8B/10B encoded bit stream.

58. The system of claim 57 wherein said 4B/5B encoding and said 8B/10B encoding are defined by the IEEE 802.3 standard.

* * * * *